(12) United States Patent
Suzuki

(10) Patent No.: US 9,322,728 B2
(45) Date of Patent: Apr. 26, 2016

(54) PRESSURE SENSOR, SENSOR ARRAY, METHOD FOR MANUFACTURING SENSOR ARRAY, AND GRASPING APPARATUS

(71) Applicant: Seiko Epson Corporation, Tokyo (JP)

(72) Inventor: Hironori Suzuki, Chino (JP)

(73) Assignee: Seiko Epson Corporation (JP)

( * ) Notice: Subject to any disclaimer, the term of this patent is extended or adjusted under 35 U.S.C. 154(b) by 317 days.

(21) Appl. No.: 13/967,867

(22) Filed: Aug. 15, 2013

(65) Prior Publication Data

US 2013/0331978 A1 Dec. 12, 2013

Related U.S. Application Data

(62) Division of application No. 13/105,247, filed on May 11, 2011, now Pat. No. 8,539,839.

(30) Foreign Application Priority Data

Mar. 28, 2011 (JP) .................................. 2011-069518
May 9, 2011 (JP) .................................. 2011-104095

(51) Int. Cl.
| | |
|---|---|
| *G01L 9/00* | (2006.01) |
| *G01L 5/22* | (2006.01) |
| *G01L 9/08* | (2006.01) |
| *G01L 11/06* | (2006.01) |
| *B25J 13/08* | (2006.01) |
| *H01L 27/20* | (2006.01) |
| *H01L 41/113* | (2006.01) |
| *H01L 41/332* | (2013.01) |
| *H01L 41/22* | (2013.01) |
| *G01L 1/02* | (2006.01) |

(52) U.S. Cl.
CPC ............... *G01L 5/226* (2013.01); *B25J 13/082* (2013.01); *G01L 1/02* (2013.01); *G01L 9/0022* (2013.01); *G01L 9/08* (2013.01); *G01L 11/06* (2013.01); *H01L 27/20* (2013.01); *H01L 41/1132* (2013.01); *H01L 41/22* (2013.01); *H01L 41/332* (2013.01); *Y10T 29/42* (2015.01)

(58) Field of Classification Search
None
See application file for complete search history.

(56) References Cited

U.S. PATENT DOCUMENTS

| | | | | |
|---|---|---|---|---|
| 5,142,912 A | * | 9/1992 | Frische | ................. G01L 9/0016 338/4 |
| 6,004,644 A | * | 12/1999 | Takeuchi | ............... C04B 35/486 264/603 |

(Continued)

FOREIGN PATENT DOCUMENTS

JP     2006-319945 A     11/2006

*Primary Examiner* — Andre Allen
(74) *Attorney, Agent, or Firm* — Harness, Dickey & Pierce, P.L.C.

(57) ABSTRACT

A pressure sensor includes: a supporting body which has an opening; a pressure detecting portion which includes a supporting film provided on the supporting body and having a diaphragm portion closing the opening, and a piezoelectric body provided on the diaphragm portion and deflecting to output an electric signal; a frame body which has, on the pressure detecting portion, a cylindrical cavity along a film thickness direction of the supporting film, and is formed, in plan view when viewed from the film thickness direction of the supporting film, at a position where a cylindrical inner peripheral wall of the cavity overlaps with the opening, or outside of the opening; a sealing film which closes the frame body; and a silicone oil which is filled in an inner space formed of the cylindrical inner peripheral wall of the cavity, the sealing film, and the pressure detecting portion.

6 Claims, 27 Drawing Sheets

(56) References Cited

U.S. PATENT DOCUMENTS

| | | | |
|---|---|---|---|
| 6,271,621 B1* | 8/2001 | Ito | G01L 1/16 310/358 |
| 7,259,032 B2 | 8/2007 | Murata et al. | |
| 2004/0100164 A1 | 5/2004 | Murata et al. | |
| 2006/0144154 A1* | 7/2006 | Ueno | G01L 1/16 73/723 |
| 2008/0030205 A1* | 2/2008 | Fujii | B81B 7/02 324/661 |
| 2009/0085441 A1* | 4/2009 | Morris | G01L 9/0022 310/338 |
| 2011/0273519 A1 | 11/2011 | Miyazawa | |
| 2013/0112910 A1 | 5/2013 | Noguchi et al. | |
| 2015/0075289 A1* | 3/2015 | Cogliati | G01L 9/0044 73/721 |

* cited by examiner

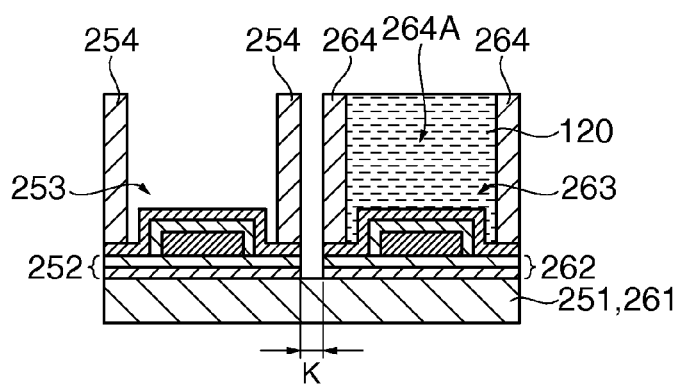
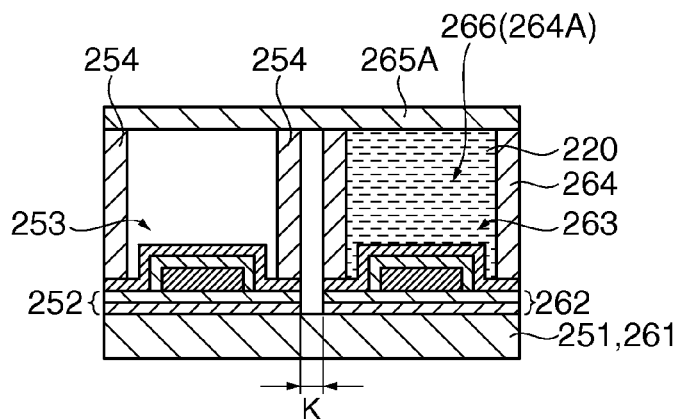
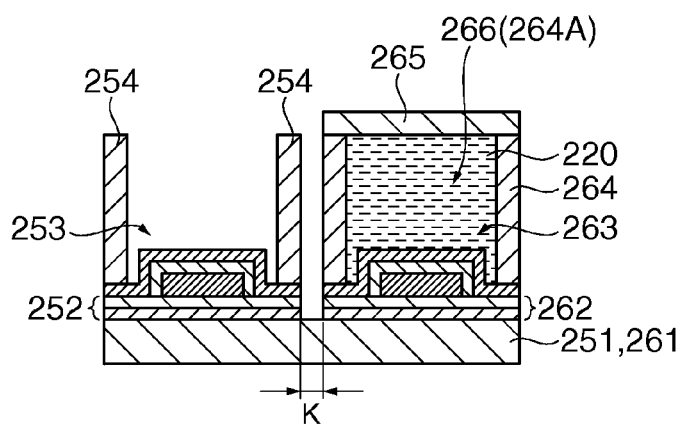
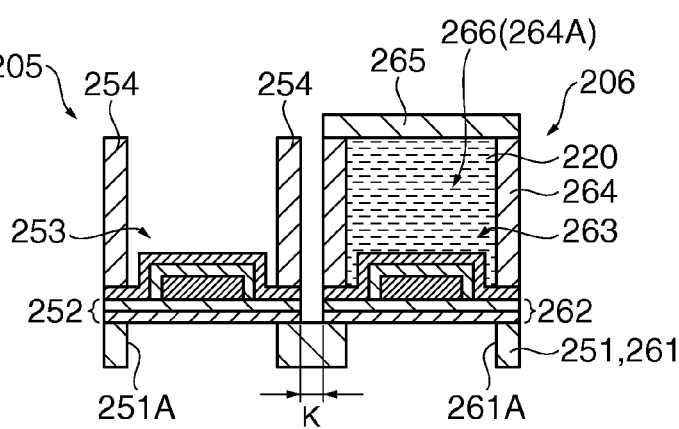

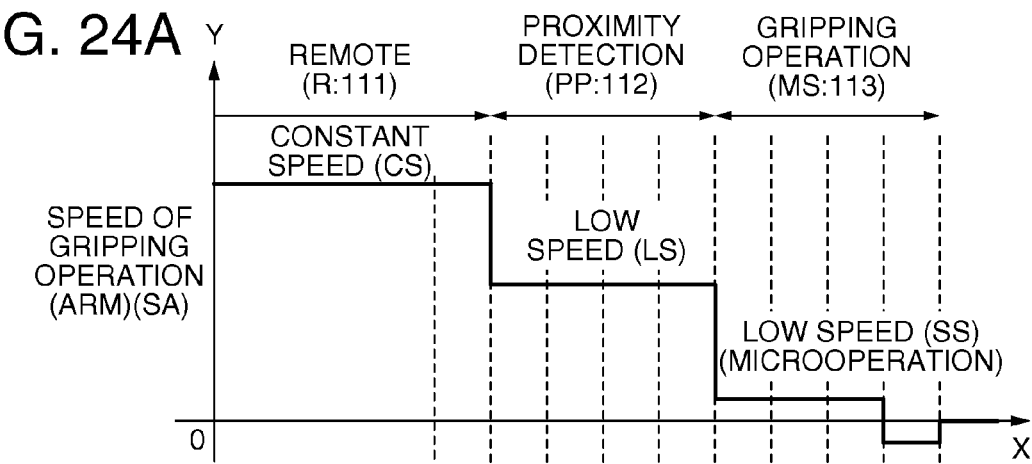
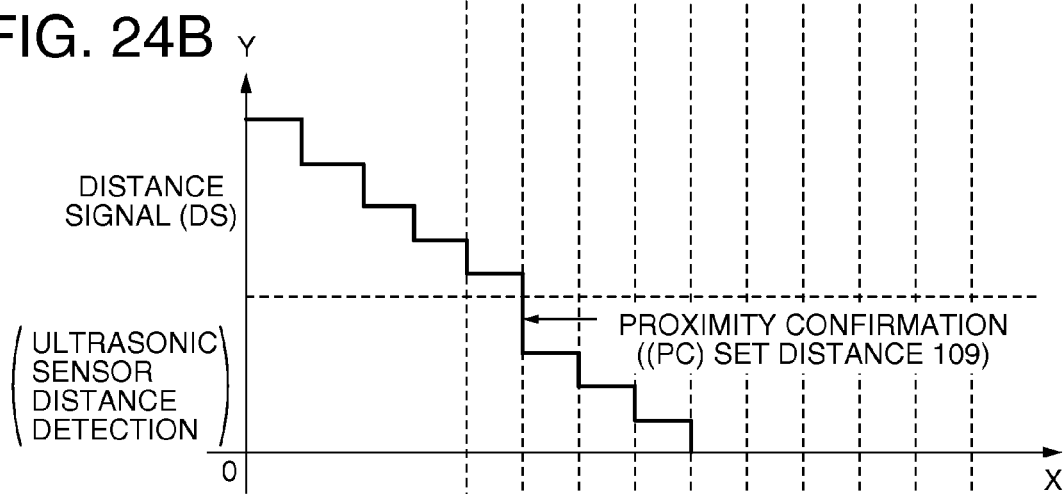
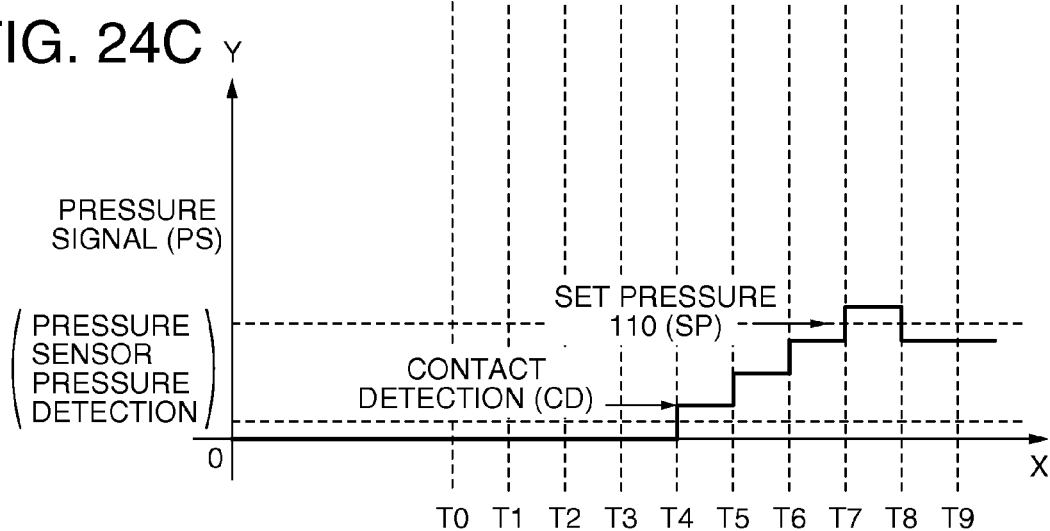

PRESSURE SENSOR, SENSOR ARRAY, METHOD FOR MANUFACTURING SENSOR ARRAY, AND GRASPING APPARATUS

CROSS-REFERENCE TO RELATED APPLICATIONS

This is a divisional patent application of U.S. application Ser. No. 13/105,247 filed May 11, 2011, which claims priority to Japanese Patent Application Nos. 2011-069518 filed Mar. 28, 2011 and 2011-104095 filed May 9, 2011 all of which are expressly incorporated by reference herein in their entireties.

BACKGROUND

1. Technical Field

The present invention relates to a pressure sensor, a sensor array, a method for manufacturing a sensor array, and a grasping apparatus.

2. Related Art

Diaphragm-type ultrasonic sensor devices have been known in the related art (for example, refer to JP-A-2006-319945).

This type of ultrasonic sensor device includes a semiconductor substrate having an opening, two layers of electrodes on an insulating film formed on the surface of the semiconductor substrate to close the opening, and a PZT ceramic thin film layer (piezoelectric film) interposed between the two layers of electrodes. Then, a membrane which has a diaphragm with a multilayer film structure stacked in a planar manner with respect to the opening and a piezoelectric body configured of the piezoelectric film and the two layers of electrodes is formed. In the ultrasonic sensor device, when a predetermined voltage is applied from the upper and lower electrodes to the PZT ceramic thin film layer, the PZT ceramic thin film layer expands and contracts in its in-plane direction, and accordingly, the diaphragm deflects and vibrates in a direction perpendicular to the plane direction to output ultrasonic waves.

In JP-A-2006-319945, a portion of the PZT ceramic thin film layer is exposed to the outside.

It has been generally known that such an ultrasonic sensor device can be applied to a pressure sensor.

For example, in the case where the pressure sensor is applied to a grasping apparatus which grasps an object, the pressure sensor detects, based on a deflection state of the piezoelectric body of the membrane, pressure when the object is grasped by arms or the like of the grasping apparatus.

In this case, since the object directly contacts the piezoelectric film exposed to the outside, a force is locally applied to the piezoelectric body or diaphragm of the membrane, causing a problem that the piezoelectric body or diaphragm of the membrane is likely to be broken.

SUMMARY

An advantage of some aspects of the invention is to solve at least a part of the problem described above, and the invention can be realized as the following modes or application examples.

FIRST APPLICATION EXAMPLE

A first application example is directed to a pressure sensor including: a supporting body which has an opening; a pressure detecting portion which includes a supporting film provided on the supporting body and having a diaphragm portion closing the opening, and a piezoelectric body provided on the diaphragm portion and deflecting to output an electric signal; a frame body which has, on the pressure detecting portion, a cylindrical cavity along a film thickness direction of the supporting film, and is formed, in plan view when viewed from the film thickness direction of the supporting film, at a position where a cylindrical inner peripheral wall of the cavity overlaps with an inner peripheral edge of the opening, or outside of the inner peripheral edge of the opening; a sealing film which closes the frame body; and a pressure medium which is filled in an inner space formed of the cylindrical inner peripheral wall of the cavity, the sealing film, and the pressure detecting portion.

According to this configuration, a portion of the supporting film where the opening is closed serves as the diaphragm portion which detects pressure, and the diaphragm portion and the piezoelectric body stacked on the diaphragm portion form a membrane. That is, in the cavity of the frame body formed on the pressure detecting portion, a portion (membrane) of the pressure detecting portion is contained.

The piezoelectric body of the pressure detecting portion is contained in the frame body, and a pressure medium which disperses a force is filled in the inner space of the frame body. The frame body is sealed by the sealing film.

Therefore, when the pressure sensor is applied to a grasping apparatus which grasps an object, the pressure generated between the sealing film and the object is transmitted to the piezoelectric body via the pressure medium. That is, the object does not directly contact the piezoelectric body, and a force when the object contacts the sealing film is transmitted to the pressure detecting portion via the pressure medium. Thus, the dispersed force is applied to the diaphragm portion of the pressure detecting portion which detects pressure. Accordingly, the local application of force to the diaphragm portion can be prevented, the breakage of the pressure detecting portion can be prevented, and further, the breakage of the membrane can be prevented. The term "on" as used herein means that a specific member is positioned in a direction from the supporting body toward the supporting film, which also includes such a case that specific members are not in contact with each other.

SECOND APPLICATION EXAMPLE

A second application example is directed to the pressure sensor according to the application example, wherein the frame body has flexibility.

According to the application example, since the frame body has flexibility, the frame body contracts when a force is applied to the frame body. Therefore, since the force is transmitted to the diaphragm portion via the pressure medium filled in the inner space of the frame body, pressure can be favorably detected.

THIRD APPLICATION EXAMPLE

A third application example is directed to a sensor array including a plurality of the pressure sensors according to the application example arranged therein, wherein a gap is formed between frame bodies of the pressure sensors next to each other.

According to the application example, a gap is formed between the frame bodies of the pressure sensors. As the gap, for example, a width is set such that the frame bodies contact each other at a value less than a deformation limit of the pressure sensor. When the pressure sensor deforms with pressure, and before the pressure sensor deforms at a value equal to or greater than the deformation limit, the pressure sensor contacts the frame body of the next pressure sensor. Then, since the frame bodies of the pressure sensors function as each other's reinforcing materials, the reliability (resistance to pressure) of the sensor array can be enhanced.

FOURTH APPLICATION EXAMPLE

A fourth application example is directed to a sensor array, including: the pressure sensor described above; and an ultrasonic sensor which has a second supporting body having a second opening, and an ultrasonic transducer portion including a second supporting film which is provided on the second supporting body and has a second diaphragm portion closing the second opening, and a second piezoelectric body which is provided on the second diaphragm portion and deflects by the application of voltage.

According to the application example, the sensor array includes two kinds of sensors, the pressure sensor and the ultrasonic sensor. Therefore, by applying the sensor array according to the application example of the invention to arms or the like of a grasping apparatus which grasps an object for example, the object can be recognized by the ultrasonic sensor, and pressure in a state where the object is grasped by the arms or the like can be detected by the pressure sensor.

The frame body of the ultrasonic sensor can be formed in the same step as that of the frame body constituting the pressure sensor. Since it is only necessary for the ultrasonic sensor to be configured of constituent members excepting a pressure medium and a sealing film, the ultrasonic sensor can be easily manufactured. That is, the ultrasonic sensor can be manufactured in the course of manufacturing the pressure sensor. Accordingly, manufacturing steps of the sensor array can be simplified, which can reduce the manufacturing cost.

FIFTH APPLICATION EXAMPLE

A fifth application example is directed to the sensor array according to the application example, wherein the ultrasonic sensor further includes a second frame body which has, on the ultrasonic transducer portion, a cylindrical second cavity along a film thickness direction of the second supporting film, and is formed, in plan view when viewed from the film thickness direction of the second supporting film, at a position where a cylindrical inner peripheral wall of the second cavity overlaps with an inner peripheral edge of the second opening, or outside of the inner peripheral edge of the second opening.

According to the application example, in the sensor array, the ultrasonic sensor includes the second frame body. Therefore, when the sensor array is applied to arms or the like of a grasping apparatus which grasps an object for example, the deterioration or breakage of the ultrasonic sensor due to contact with the object can be prevented.

SIXTH APPLICATION EXAMPLE

A sixth application example is directed to the sensor array according to the application example, wherein the sensor array includes a plurality of the pressure sensors and a plurality of the ultrasonic sensors, and a gap is formed between frame bodies of the pressure sensors next to each other, between second frame bodies of the ultrasonic sensors next to each other, or between a frame body of the pressure sensor and a second frame body of the ultrasonic sensor next to each other.

According to the application example, the ultrasonic sensor and the pressure sensor are next to each other via a gap. Therefore, the transmission of vibrations of the second diaphragm portion of the ultrasonic sensor is suppressed by the gap portion. Therefore, since the vibrations from the ultrasonic sensor reach the pressure sensor in an attenuated state, it is possible to provide a sensor array which can detect pressure with good accuracy.

SEVENTH APPLICATION EXAMPLE

A seventh application example is directed to the sensor array according to the application example, wherein the supporting body and the second supporting body are a common supporting body which is common to them, and a height from the common supporting body to a top of the pressure sensor is higher than a height from the common supporting body to a top of the ultrasonic sensor.

According to the application example, the top of the pressure sensor serves as an abutment surface. That is, since the top of the pressure sensor abuts on an object prior to the top of the ultrasonic sensor, the top of the ultrasonic sensor does not contact the object in this state. Therefore, the ultrasonic sensor can escape deterioration due to pressure and can maintain high reliability (resistance to pressure).

EIGHTH APPLICATION EXAMPLE

An eighth application example is directed to the sensor array according to the application example, wherein the pressure sensors and the ultrasonic sensors have a two-dimensional array structure in which the pressure sensor and the ultrasonic sensor are alternately arranged.

According to the application example, since the pressure sensors and the ultrasonic sensors have a two-dimensional array structure in which the pressure sensor and the ultrasonic sensor are alternately arranged, a position at which the ultrasonic sensor recognizes an object and a position at which the pressure sensor detects a force grasping the object are substantially the same position of the object. Therefore, position control by the ultrasonic sensor and pressure control by the pressure sensor can be smoothly switched from one to the other.

NINTH APPLICATION EXAMPLE

A ninth application example is directed to the sensor array according to the application example, wherein a dimension of the gap is set such that when a first pressure is applied to the pressure sensor, the frame body deforms to contact the frame body of the next pressure sensor or contact the second frame body of the next ultrasonic sensor, and the first pressure is smaller than an allowable pressure of the pressure sensor.

According to the application example, a gap is formed between the pressure sensors next to each other, between the ultrasonic sensors next to each other, or between the pressure sensor and the ultrasonic sensor next to each other. In this case, the dimension of the gap is set such that when the frame body of the pressure sensor is deformed by a first pressure, the frame body contacts the frame body of the next pressure sensor or the second frame body of the next ultrasonic sensor in a state less than the allowable pressure of the pressure sensor. Then, since the frame body contacts the frame body of the pressure sensor or the second frame body of the ultrasonic sensor with the first pressure in the range of the allowable pressure of the pressure sensor, the frame bodies function as each other's reinforcing materials. Therefore, the reliability (resistance to pressure) of the sensor array can be enhanced. The term "allowable pressure" as used herein means a maximum pressure by which the diaphragm portion or the second diaphragm portion of the pressure sensor or the ultrasonic sensor is not broken.

TENTH APPLICATION EXAMPLE

A tenth application example is directed to a method for manufacturing a sensor array including a plurality of pressure sensors, including: forming a supporting film on a supporting body and forming a piezoelectric body on the supporting film to thereby form a plurality of pressure detecting portions; forming, on the plurality of pressure detecting portions, a frame body layer which covers the piezoelectric body; removing portions of the frame body layer formed in the forming of the frame body layer to thereby form frame bodies each of which includes a cavity having a cylindrical inner peripheral wall so as to have a gap between frame bodies next to each other; filling a pressure medium in the cavity; and forming, by a roll coating method, a sealing film which closes the cavity to seal the pressure medium.

According to this configuration, a sensor array including a plurality of pressure sensors defined with a gap can be manufactured. A dimension of the gap is set such that when the frame body of the pressure sensor is deformed, the frame body contacts the frame body of the next pressure sensor in a state less than an allowable pressure of the pressure sensor, whereby it is possible to form frame bodies which use the frame bodies of the pressure sensors as each other's reinforcing materials in a range of the allowable pressure of the pressure sensor. By providing the gap, it is possible to provide a method for manufacturing a sensor array in which interference from the next pressure sensor can be suppressed.

ELEVENTH APPLICATION EXAMPLE

An eleventh application example is directed to the method for manufacturing the sensor array according to the application example, further including forming a groove which divides the supporting film at a position overlapping with the gap in plan view when the supporting film is viewed from a film thickness direction thereof.

According to the application example, it is possible to avoid interference between the pressure sensors. Since the pressure sensors are connected to each other via the groove, and therefore, interference is suppressed, it is possible to provide a method for manufacturing a sensor array which can detect pressure with high accuracy.

TWELFTH APPLICATION EXAMPLE

A twelfth application example is directed to the method for manufacturing the sensor array according to the application example, further including: bonding a sensor substrate to the lower side of the supporting body; and forming, while leaving at least a portion of the sensor substrate, a groove which divides the supporting body in the gap.

According to the application example, it is possible to provide a method for manufacturing a sensor array which avoids interference between the pressure sensors. Since a groove formed by removing the supporting body is formed between the pressure sensors, the pressure sensors do not interfere with each other, making it possible to provide a method for manufacturing a sensor array which can detect pressure with high accuracy. The term "lower side" as used herein means a direction opposite to the direction indicated by the "on" described above.

THIRTEENTH APPLICATION EXAMPLE

A thirteenth application example is directed to the method for manufacturing the sensor array according to the application example, further including: dividing, after the forming of the sealing film, the sensor array into blocks each of which includes one or more the pressure sensors; and bonding the block to a sensor substrate such that the lower side of the pressure sensor is positioned on the sensor substrate side.

According to the application example, since the pressure sensors are once divided and then bonded to the sensor substrate, the application example can deal with a sensor substrate larger than a supporting body.

FOURTEENTH APPLICATION EXAMPLE

A fourteenth application example is directed to a method for manufacturing a sensor array including a plurality of pressure sensors and a plurality of ultrasonic sensors, including: forming a supporting film on a supporting body and forming a piezoelectric body on the supporting film to thereby form a plurality of pressure detecting portions and a plurality of ultrasonic transducer portions; forming, on the plurality of pressure detecting portions and the plurality of ultrasonic transducer portions, a frame body layer which covers the piezoelectric body; removing portions of the frame body layer formed in the forming of the frame body layer to thereby form a plurality of frame bodies which are defined by a gap and each of which includes a cavity having a cylindrical inner peripheral wall; filling a pressure medium in some of the cavities; and forming, by a roll coating method, a sealing film which closes the cavity to seal the pressure medium.

According to this configuration, a sensor array including a plurality of pressure sensors and a plurality of ultrasonic sensors which are defined with a gap can be manufactured. A dimension of the gap is set such that when the frame body of the pressure sensor is deformed, the frame body contacts the next pressure sensor or the second frame body of the next ultrasonic sensor in a state less than an allowable pressure of the pressure sensor, whereby it is possible to provide a method for manufacturing frame bodies which use the frame body of the pressure sensor or the second frame body of the ultrasonic sensor as each other's reinforcing materials in the range of the allowable pressure of the pressure sensor. Moreover, by providing the gap, it is possible to provide a method for manufacturing a sensor array in which interference from the next pressure sensor or ultrasonic sensor can be suppressed.

FIFTEENTH APPLICATION EXAMPLE

A fifteenth application example is directed to the method for manufacturing the sensor array according to the application example, further including forming a groove which divides the supporting film at a position overlapping with the gap in plan view when the supporting film is viewed from a film thickness direction thereof.

According to the application example, the ultrasonic sensor and the pressure sensor are formed so as to be next to each other via a groove formed by removing the supporting film. Therefore, the vibrations of the second diaphragm portion of the ultrasonic sensor are absorbed by the groove portion. That is, since the vibrations from the ultrasonic sensor reach the pressure sensor in an attenuated state, it is possible to provide a method for manufacturing a sensor array including a pressure sensor which can detect pressure with good accuracy.

SIXTEENTH APPLICATION EXAMPLE

A sixteenth application example is directed to the method for manufacturing the sensor array according to the application example, further including: bonding a sensor substrate to the lower side of the supporting body; and forming, while leaving at least a portion of the sensor substrate, a groove which divides the supporting body at a position overlapping with the gap in plan view when the supporting film is viewed from a film thickness direction thereof.

According to the application example, it is possible to provide a manufacturing method by which interference between the pressure sensors or the ultrasonic sensors can be avoided. Since the pressure sensors or the ultrasonic sensors are formed by mechanically dividing them including the supporting body, they do not interfere with each other, making it possible to provide a method for manufacturing a sensor array which can detect pressure with high accuracy.

SEVENTEENTH APPLICATION EXAMPLE

A seventeenth application example is directed to the method for manufacturing the sensor array according to the application example, further including: dividing, after the forming of the sealing film, the sensor array into blocks each of which includes one or more the pressure sensors or the ultrasonic sensors; and bonding the block to a sensor substrate such that the lower side of the pressure sensor is positioned on the sensor substrate side.

According to the application example, since the ultrasonic sensors or the pressure sensors are once divided and then bonded to the sensor substrate, the application example can deal with a sensor substrate larger than a supporting body.

EIGHTEENTH APPLICATION EXAMPLE

An eighteenth application example is directed to a grasping apparatus including the sensor array described above and grasping an object, including: a pair of grasping arms which grasp the object and each of which is provided with at least one the sensor array on a contact surface with which the object contacts; a grasp detecting unit which detects a grasping state of the object based on an electric signal output from the sensor array; and a drive control unit which controls the driving of the grasping arms based on the grasping state.

According to this configuration, when an object is away from the grasping arms, the driving speed of the grasping arms is increased for operation, whereby the time until the grasping arms approach the object can be shortened. When the object is close to the grasping arms, the driving speed of the grasping arms is reduced, whereby a collision between the grasping arms and the object can be avoided. After the contact of the object with the grasping arms, grasping pressure can be adjusted using a signal from the pressure sensor. That is, it is possible to provide a grasping apparatus which can grasp an object with precise grasping pressure in a short time.

BRIEF DESCRIPTION OF THE DRAWINGS

The invention will be described with reference to the accompanying drawings, wherein like numbers reference like elements.

FIGS. 17A to 17D are step cross-sectional views for explaining manufacturing steps of the sensor array.
FIGS. 24A to 24C are timing diagrams for explaining the grasping operation of the grasping apparatus.

DESCRIPTION OF EXEMPLARY EMBODIMENTS

Figure 1:
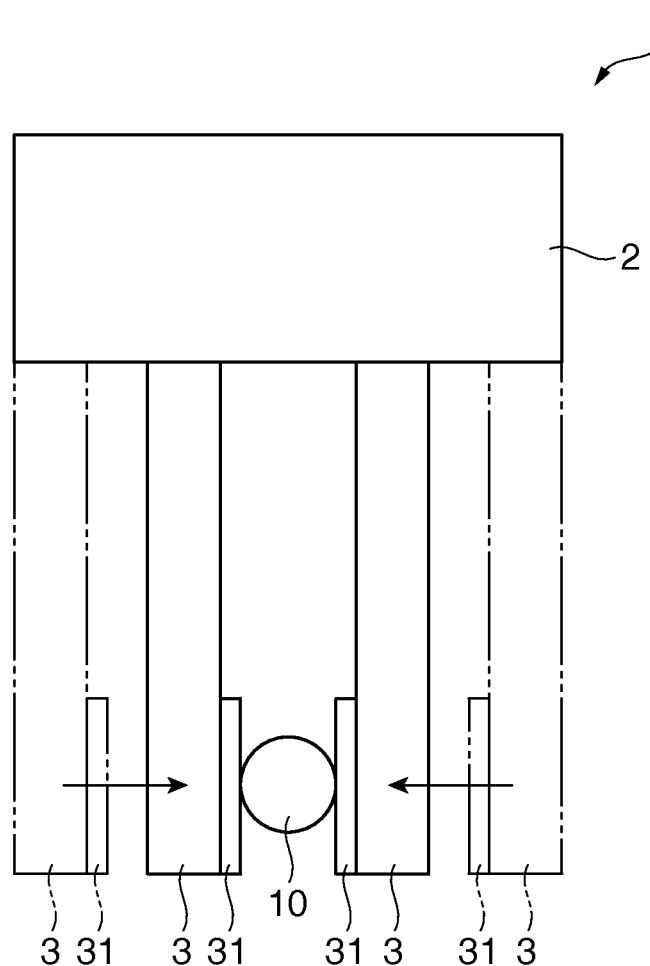
FIG. 1 is a schematic view of a grasping apparatus.

Hereinafter, embodiments according to the invention will be described based on the drawings.
First Embodiment
Schematic Configuration of Grasping Apparatus
FIG. 1 is a schematic view of a grasping apparatus 1.
The grasping apparatus 1 is an apparatus which grasps, for example, an object 10. The grasping apparatus 1 recognizes the position of the object 10 to grasp the object. The grasping apparatus 1 includes a supporting member 2 and a pair of arms 3 as grasping arms which extend from the supporting member 2.
The supporting member 2 is formed in a longitudinal rod shape and includes a drive mechanism which moves the pair of arms 3 toward and/or away from each other.
The arms 3 are portions which grasp the object 10 and operate in directions toward and/or away from each other. At a portion of the arm 3 with which the object 10 contacts, a substantially rectangular grasping surface 31, for example, is formed. A sensor array 4 (refer to FIG. 2) is attached to the grasping surface 31.

Configuration of Sensor Array

Figure 2:
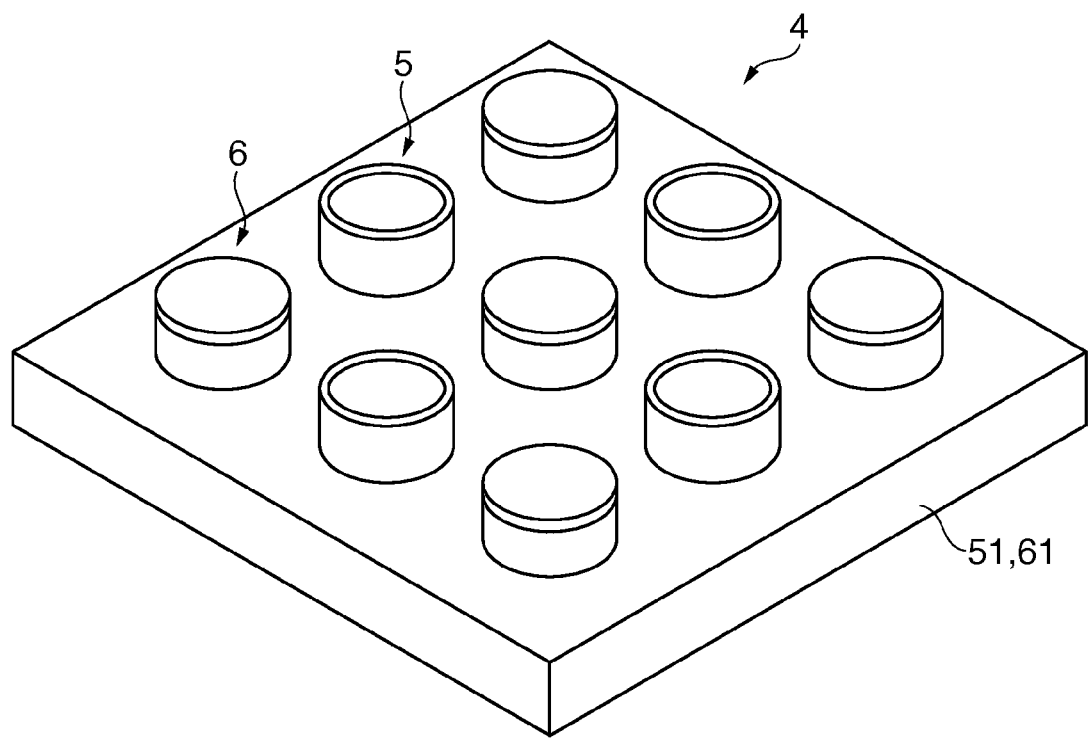
FIG. 2 is a perspective view showing a sensor array.
Figure 7A:
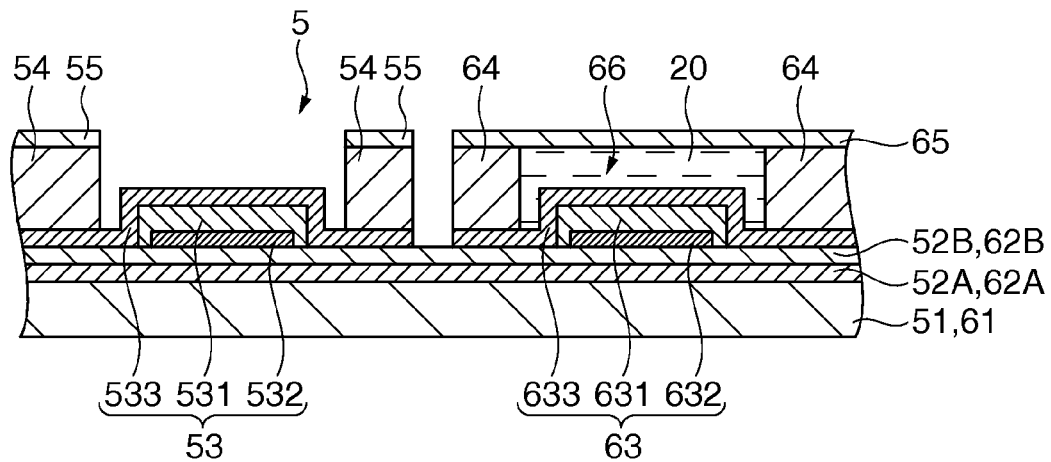
FIGS. 7A and 7B show manufacturing steps of the sensor array.
Figure 7B:
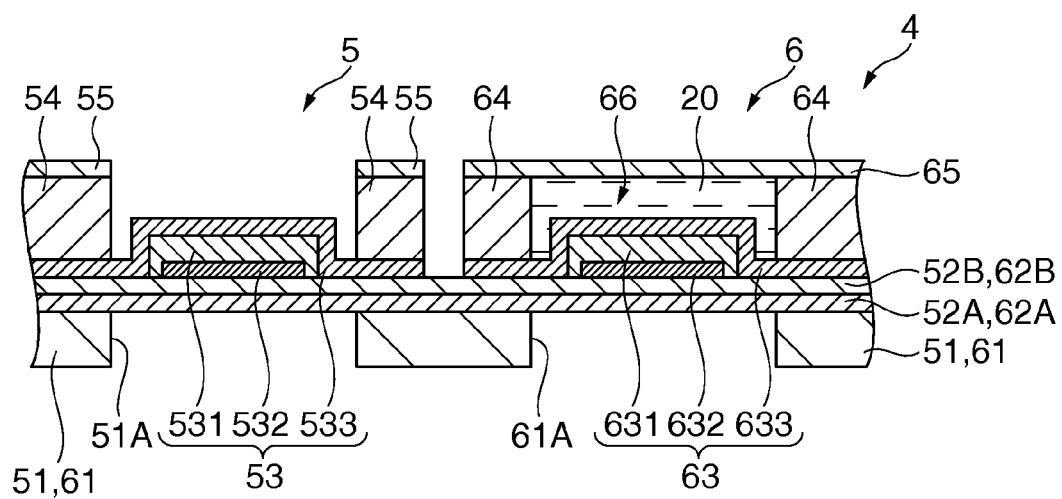

FIG. 2 is a perspective view showing a sensor array including ultrasonic sensors and pressure sensors. FIG. 7B is a step cross-sectional view showing a manufacturing step of the sensor array and is also a cross-sectional view showing the structure of the sensor array shown, in FIG. 2, which includes a common supporting body 51, 61 supporting the ultrasonic sensors 5 and the pressure sensors 6.

The sensor array 4 shown in FIG. 7B has the common supporting body 51, 61 in which the supporting body 61 provided with the pressure sensor and the second supporting body 51 provided with the ultrasonic sensor are used in common. The sensor array 4 includes the plurality of ultrasonic sensors 5 and the plurality of pressure sensors 6 which are mounted on the common supporting body 51, 61. Moreover, in the sensor array 4, the ultrasonic sensors 5 and the pressure sensors 6 have a two-dimensional array structure in which the ultrasonic sensor 5 and the pressure sensor 6 are alternately arranged along, for example, a predetermined first direction (X-direction) and a second direction (Y-direction) perpendicular to the first direction (X-direction).

The ultrasonic sensor 5 and the pressure sensor 6 are provided on the common supporting body 51, 61 which is provided in common to the ultrasonic sensor 5 and the pressure sensor 6, and are electrically conducted to a not-shown control portion via an electrode pattern which is formed on the common supporting body 51, 61. A gap is provided between second frame bodies 54, between frame bodies 64, and between the second frame body 54 and the frame body 64.

In the following description, the common supporting body 51, 61 will be described while being appropriately separated into the supporting body 61 and the second supporting body 51.

The term "on" as used herein means that a specific member is positioned in a direction from the common supporting body 51, 61 toward the frame body 64 and the second frame body 54, which also includes such a case that specific members are not in contact with each other.

Configuration of Ultrasonic Sensor

Figure 3A:
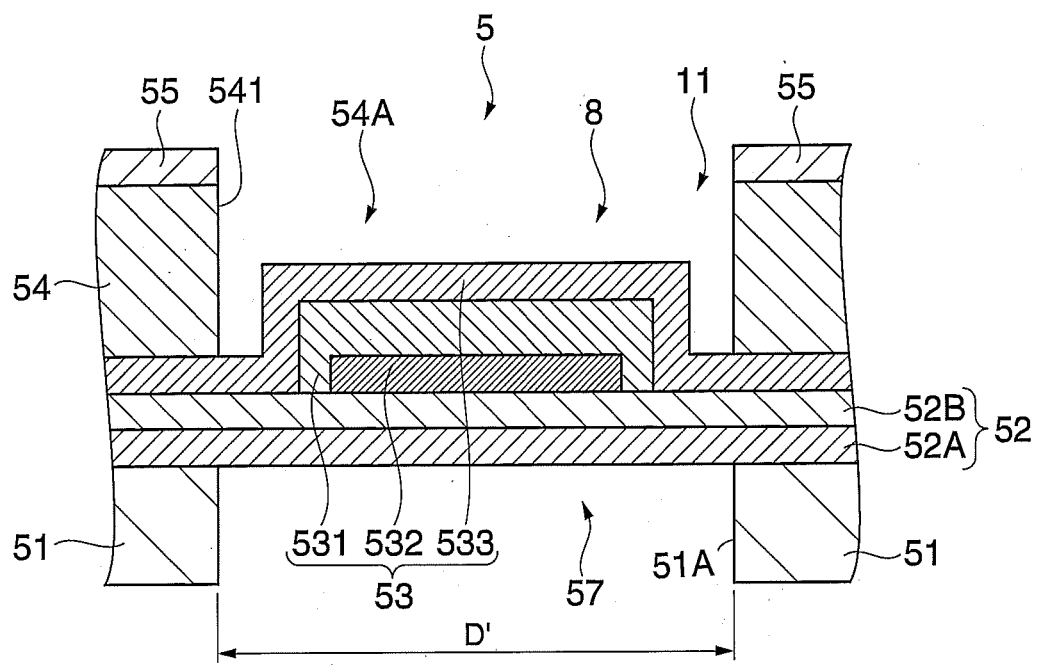
FIGS. 3A and 3B are cross-sectional views showing an ultrasonic sensor and a pressure sensor, respectively.

FIG. 3A is a cross-sectional view showing the configuration of the ultrasonic sensor 5.

The ultrasonic sensor 5 transmits ultrasonic waves to the object 10 and receives reflected waves, thereby detecting the presence or absence of the object 10, or the distance to the object 10. The ultrasonic sensor 5 includes a second supporting film 52, a second piezoelectric body 53, the second frame body 54, and a protective film 55 which are stacked in order on the second supporting body 51.

The second supporting film 52 and the second piezoelectric body 53 constitute an ultrasonic transducer portion 11.

The second supporting body 51 is formed of a single-crystal silicon substrate and formed to a thickness of about 200 μm. Moreover, in the second supporting body 51, a circular second opening 51A, in plan view when the second supporting film 52 is viewed from its film thickness direction, is formed by dry etching.

The second supporting film 52 closes the second opening 51A of the second supporting body 51, is configured of a first oxide film 52A and a second oxide film 52B which are stacked on the surface of the second supporting body 51, and is formed of the two layers. A portion of the second supporting film 52 where the second opening 51A is closed serves as a second diaphragm portion 57. The second diaphragm portion 57 and the second piezoelectric body 53 which is provided on the second diaphragm portion 57 and deflects by the application of voltage constitute a membrane 8.

The first oxide film 52A is formed of, for example, $SiO_2$ and formed to a thickness of about 1 μm by thermally oxidizing the surface of the single-crystal silicon substrate of the second supporting body 51. The first oxide film 52A may be formed by, other than the thermal oxidation of the surface, a chemical vapor deposition (CVD) method using tetraethoxysilane (TEOS), sputtering, vapor deposition, coating, or the like.

The second oxide film 52B is formed of, for example, $ZrO_2$ and formed on the first oxide film 52A so as to finally have a thickness of about 3 μm by depositing Zr by sputtering and thermally oxidizing the same. The second oxide film 52B is a layer for preventing the peeling of a later-described second piezoelectric film 531 of the second piezoelectric body 53 when the second piezoelectric film 531 is formed by baking. That is, when the second piezoelectric film 531 (for example, lead zirconate titanate (PZT)) is baked, in the case where the second oxide film 52B is not formed, Pb is diffused in the first oxide film 52A. Therefore, the melting point of the second oxide film 52B is lowered, and air bubbles are generated on the surface of the first oxide film 52A, whereby the second piezoelectric film 531 is peeled due to the air bubbles. Moreover, when the second oxide film 52B is not present, there also arises a problem that the deflection efficiency to the strain of the second piezoelectric film 531 is reduced. On the other hand, by forming the second oxide film 52B on the first oxide film 52A, inconveniences such as the peeling of the second piezoelectric film 531 or the decrease in deflection efficiency can be avoided. The second oxide film 52B may be formed by a CVD method, vapor deposition, coating, or the like other than a sputtering method.

In this case, a diameter dimension D' of the second opening 51A is appropriately set in a range from, for example, about one hundred μm to several hundreds μm according to the natural frequency of the second diaphragm portion 57. The second diaphragm portion 57 vibrates, so that ultrasonic waves are transmitted toward the object 10 (refer to FIG. 1) side.

The second piezoelectric body 53 is a film-like member which is formed concentrically with the second opening 51A in plan view of the sensor. The diameter dimension of the second piezoelectric body 53 is smaller than the diameter dimension D' of the second opening 51A. The second piezoelectric body 53 includes the second piezoelectric film 531 and electrodes (a lower electrode 532 and an upper electrode 533) which apply voltage to the second piezoelectric film 531. The term "diameter dimension of piezoelectric body" as used herein means the diameter of a region where the lower electrode, the piezoelectric film, and the upper electrode are stacked.

The piezoelectric film 531 is formed of, for example, PZT made into a film. Although, in the embodiment, PZT is used as the piezoelectric film 531, any material may be used as long as the material can contract and expand in an in-plane direction by the application of voltage. For example, lead titanate ($PbTiO_3$), lead zirconate ($PbZrO_3$), lead lanthanum titanate (($Pb, La)TiO_3$), or the like may be used.

The lower electrode 532 and the upper electrode 533 are electrodes which are formed with the piezoelectric film 531 interposed therebetween.

The lower electrode 532 is formed below the second piezoelectric film 531. The upper electrode 533 is formed on the second piezoelectric film 531.

The upper electrode 533 and the lower electrode 532 are drawn through a not-shown drawing portion which is formed on the back side (the second opening 51A side) of the second diaphragm portion 57, are connected to the not-shown control portion of the sensor array 4, and apply a predetermined voltage to the piezoelectric film 531 based on a voltage signal input from the control portion.

The second frame body 54 is cylindrically formed of a permanent resist made of a synthetic resin material having flexibility and formed to a thickness of about 100 μm to 600 μm. Moreover, with a cylindrical inner peripheral wall 541 provided in the second frame body 54, a cavity 54A along the film thickness direction of the second supporting film 52 is formed. The second frame body 54 is formed such that in plan view when viewed from the film thickness direction of the second supporting film 52, a cylindrical inner peripheral edge of the cavity 54A which is cylindrical is positioned to be overlapped with an inner peripheral edge of the second opening 51A or positioned outside of the inner peripheral edge. In this case, the inner diameter dimension of the second frame body 54 is formed so as to have substantially the same dimension as that of the second opening 51A (in the case of overlapping). In the cavity 54A of the second frame body 54, the membrane 8 is contained. For example, the second frame body 54 can be formed using permanent resist TMMR™ S2000 of TOKYO OHKA KOGYO CO., LTD.

As the material for forming the second frame body 54, a photosensitive resin film such as of a dry film resist may be used other than a permanent resist.

The protective film 55 is a portion which contacts the object 10, is formed of a dry film resist made of a synthetic resin material having flexibility, similarly to the second frame body 54, and is formed to a thickness of about 100 μm. Moreover, the protective film 55 is formed in a ring shape to cover an upper end surface of the second frame body 54. For example, the protective film 55 can be formed using dry film resist TMMF™ S2000 of TOKYO OHKA KOGYO CO., LTD.

Operation of Ultrasonic Sensor

In the ultrasonic sensor 5 described above, when a drive voltage having a predetermined cycle is applied from the control portion between the lower electrode 532 and the upper electrode 533 of the second piezoelectric body 53, the piezoelectric film 531 expands or contracts in its plane direction.

When the piezoelectric film 531 contracts in the plane direction, the second piezoelectric body 53 side of the second diaphragm portion 57 is contracted in the plane direction, so that the second diaphragm portion 57 convexly deflects toward the second supporting body 51 side. When the piezoelectric film 531 expands in the plane direction, the second piezoelectric body 53 side of the second diaphragm portion 57 is expanded in the plane direction, so that the second diaphragm portion 57 convexly deflects toward the second piezoelectric body 53 side.

Thus, the second diaphragm portion 57 vibrates in a direction perpendicular to the plane direction of the second supporting film 52, and ultrasonic waves at a frequency according to the predetermined drive voltage cycle is transmitted from the second diaphragm portion 57. That is, the second diaphragm portion 57 functions as a transmitting portion which transmits ultrasonic waves toward the object 10 (refer to FIG. 1). Further, the second diaphragm portion 57 also functions as a receiving portion which receives ultrasonic waves reflected by the object 10. That is, in the control portion of the sensor array 4, the position of the object 10 can be detected based on the time from the transmission of ultrasonic waves to the reception of ultrasonic waves reflected by the object 10 and the intensity of vibrations.

Configuration of Pressure Sensor

Figure 3B:
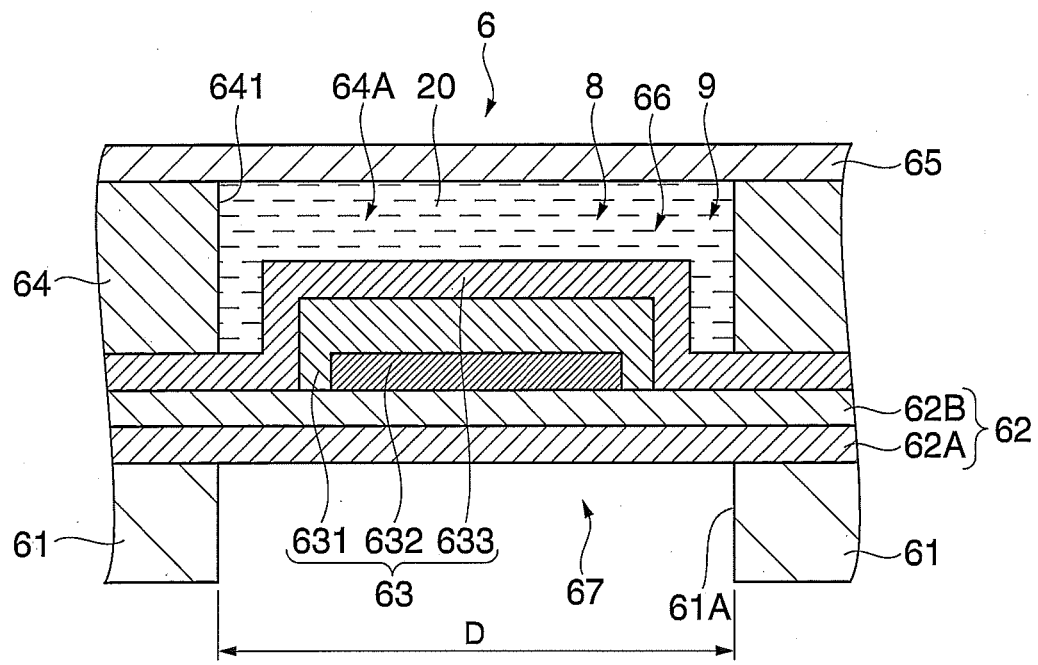

FIG. 3B is a cross-sectional view showing the pressure sensor 6.

The pressure sensor 6 detects pressure when, for example, the grasping surfaces 31 of the arms 3 of the grasping apparatus 1 (refer to FIG. 1) grasp the object 10. The pressure sensor 6 provided on the grasping surface 31 includes a supporting film 62, a piezoelectric body 63 (a piezoelectric film 631, a lower electrode 632, and an upper electrode 633), the frame body 64, and a sealing film 65 which are stacked in order on the supporting body 61.

In this case, the supporting body 61 is a common supporting body which is common with the second supporting body 51 of the ultrasonic sensor 5, and the configurations of the supporting film 62, the piezoelectric body 63, and the frame body 64 are similar to those of the second supporting film 52, the second piezoelectric body 53, and the second frame body 54 of the ultrasonic sensor 5, respectively. Therefore, the description is omitted.

The supporting film 62 and the piezoelectric body 63 constitute a pressure detecting portion 9.

The frame body 64 is formed cylindrically, similarly to the second frame body 54 of the ultrasonic sensor 5, and has a cavity 64A. In the cavity 64A, the membrane 8 including a diaphragm portion 67 which is a portion of the supporting film 62 where an opening 61A is closed and the piezoelectric body 63 provided on the diaphragm portion 67 is contained.

A silicone oil 20 as a pressure medium is filled in an inner space 66 formed of a cylindrical inner peripheral wall 641 of the cavity 64A, the sealing film 65, and the pressure detecting portion 9.

The sealing film 65 closes the inner space 66 to seal the silicone oil 20. As the material to be filled in the inner space 66, any material which disperses pressure may be used. Other than the silicone oil 20, for example, a silicone rubber, a polymer gel, a synthetic gel, a natural gel, a polymer resin, or the like may be used. The frame body 64 is formed such that in plan view when viewed from the film thickness direction of the supporting film 62, a cylindrical inner peripheral edge of the cavity 64A which is cylindrical is positioned to be overlapped with an inner peripheral edge of the opening 61A or positioned outside of the inner peripheral edge. In this case, the inner diameter dimension of the frame body 64 is formed so as to have substantially the same dimension as a diameter dimension D of the opening 61A (in the case of overlapping).

The sealing film 65 is a portion which contacts the object 10 (refer to FIG. 1), similarly to the protective film 55, and is formed in a circular shape so as to close the inner space 66 to seal the silicone oil 20. Moreover, the sealing film 65 is a portion which seals the silicone oil 20 and contacts the object 10. The sealing film 65 is formed of a material similar to that of the protective film 55. For example, the sealing film 65 can be formed using dry film resist TMMF™ S2000 of TOKYO OHKA KOGYO CO., LTD.

As the material for forming the sealing film 65, a photosensitive resin film such as of a permanent resist may be used other than a dry film resist.

Since the silicone oil 20 is filled in the inner space 66, an impact when the object 10 contacts the sealing film 65 is dispersed over the entire membrane 8.

When a pressure medium filled in the inner space 66 is a material which does not leak, such as a polymer gel, the sealing film 65 may not be provided.

Operation of Pressure Sensor

In the pressure sensor 6 described above, when the object 10 is grasped by the arms 3 as shown in FIG. 1, the object 10 abuts on the sealing film 65 shown in FIG. 3B, and the frame body 64 contracts in the thickness direction. In this case, the silicone oil 20 filled in the inner space 66 of the frame body 64 disperses a force when the object 10 abuts on the sealing film 65 over the entire membrane 8, and the force is transmitted to the diaphragm portion 67. The diaphragm portion 67 deflects with the transmitted force, and voltage according to the deflection amount is generated in the piezoelectric film 631. Thus, an electric signal according to the generated voltage is output from the upper electrode 633 and the lower electrode 632, whereby pressure is detected.

Method for Manufacturing Sensor Array

Next, a method for manufacturing a sensor array will be described.

FIGS. 4A to 7B are step cross-sectional views showing manufacturing steps of a sensor array having the structure. In FIGS. 4A to 7B, manufacturing steps of the ultrasonic sensor 5 are shown on the left while manufacturing steps of the pressure sensor 6 are shown on the right.

In the following description, a pair of ultrasonic sensor 5 and pressure sensor 6 are described. However, this is applicable also to the case of a plurality of ultrasonic sensors 5 and a plurality of pressure sensors 6 (refer to FIG. 2).

Figure 4A:
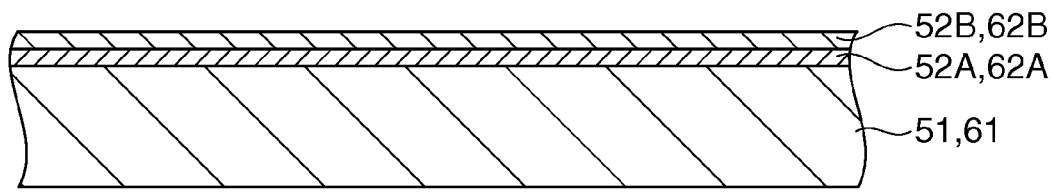
FIGS. 4A to 4C show manufacturing steps of the sensor array.

First, a single-crystal silicon substrate which serves as the common supporting body 51, 61 (a thickness of about 650 µm) where the opening 61A and the second opening 51A are not formed is prepared, and the surface of the substrate is thermally oxidized, whereby the first oxide film 52A, 62A formed of $SiO_2$ is formed so as to have a thickness of about 1 µm. Using $ZrO_2$ formed by depositing Zr by sputtering and thermally oxidizing the same, the second oxide film 52B, 62B is formed on the first oxide film 52A, 62A so as to have a thickness of about 3 µm. FIG. 4A shows the cross-sectional view in a state where the step so far is completed.

Figure 4B:
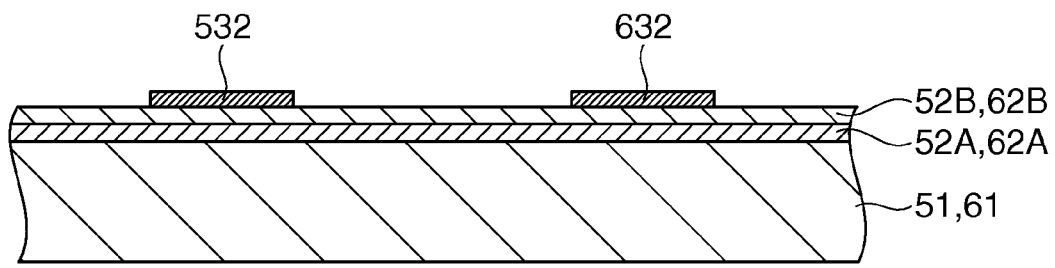

Next, in an argon gas atmosphere under a predetermined pressure, a substance for lower electrode is deposited by sputtering on the second oxide film 52B, 62B. A not-shown photoresist is coated on a surface where the common supporting film 52, 62 is formed so as to be stacked on the common supporting body 51, 61, and exposed and developed by a photolithography method. Further by an etching process, the lower electrodes 532 and 632 are patterned. In this case, any value can be taken for a gap between the lower electrodes 532 and 632 as long as the electrodes are not in contact with each other. FIG. 4B shows the cross-sectional view in a state where the steps so far are completed.

Figure 4C:
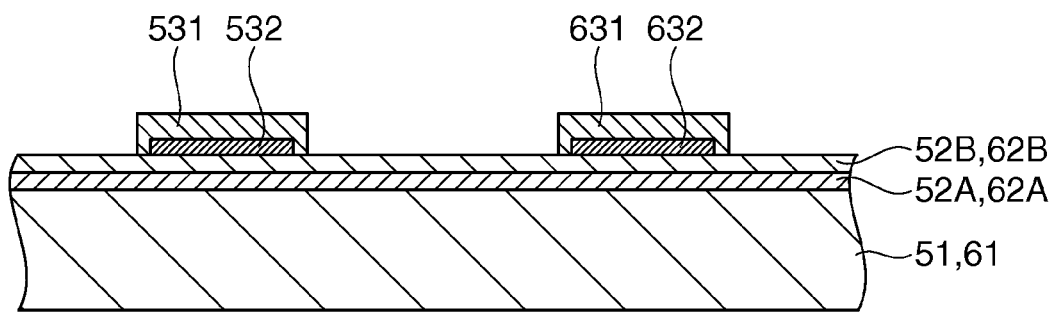

Next, a substance for the piezoelectric films 531 and 631 is deposited by sputtering on the lower electrodes 532 and 632. By patterning by a photolithography method and an etching process, the piezoelectric films 531 and 631 are formed. FIG. 4C shows the cross-sectional view in a state where the steps so far are completed.

Figure 5A:
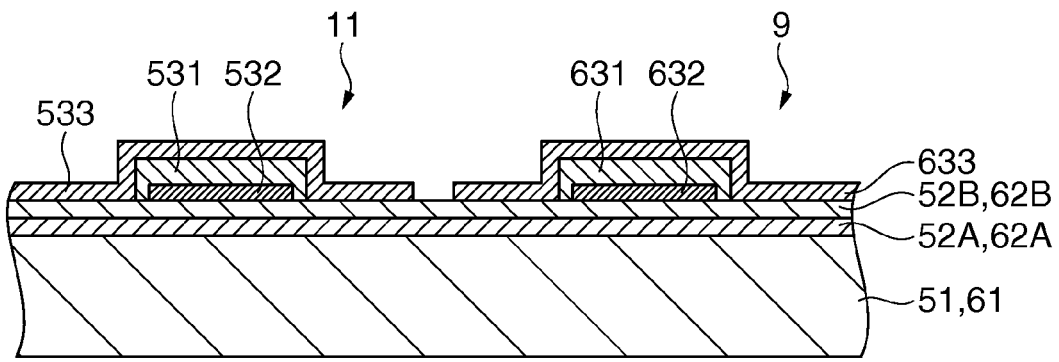
FIGS. 5A to 5C show manufacturing steps of the sensor array.

Next, a substance for the upper electrodes 533 and 633 is deposited by sputtering so as to cover the lower electrodes 532 and 632 and the second oxide film 52B, 62B. By patterning by a photolithography method and an etching process, the upper electrodes 533 and 633 are formed. Thus, the ultrasonic transducer portion 11 and the pressure detecting portion 9 are formed on the ultrasonic sensor 5 side and the pressure sensor 6 side, respectively (piezoelectric body sensor portion forming step). FIG. 5A shows the cross-sectional view in a state where the steps so far are completed.

Figure 5B:
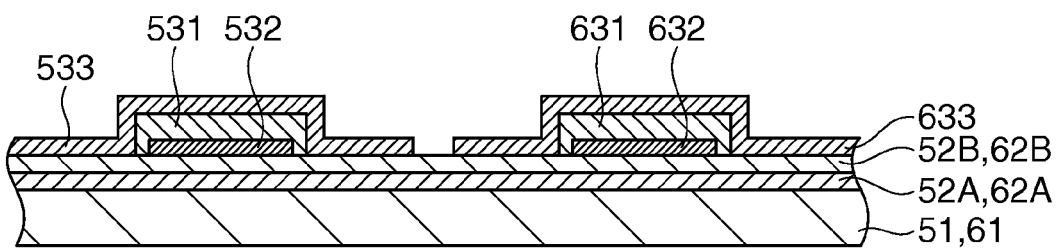

Next, the common supporting body 51, 61 is grinded so that the thickness is reduced to about 200 µm. This is because when the common supporting body 51, 61 which has been grinded to a desired thickness dimension is prepared in the first step, the common supporting body 51, 61 may be warped during the manufacturing steps. FIG. 5B shows the cross-sectional view in a state where the steps so far are completed.

Figure 5C:
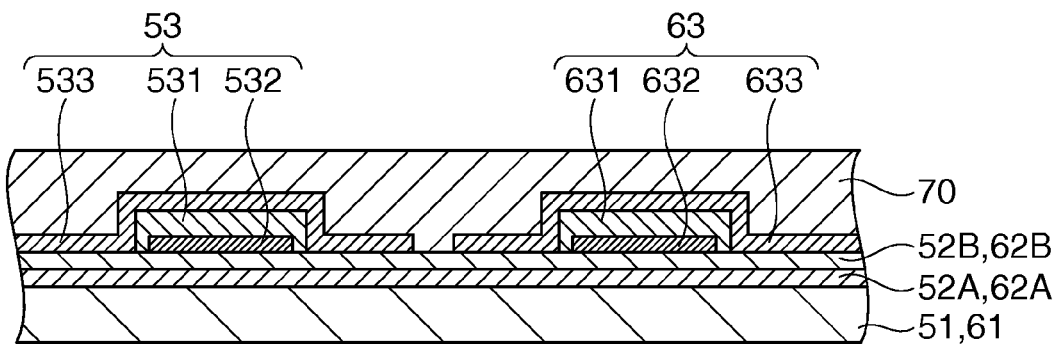

Next, a permanent resist is coated as a frame body layer 70 on the upper electrodes 533 and 633 using a spin coating apparatus or a squeegee. Thus, the frame body layer 70 is formed so as to cover the piezoelectric body 63 and the second piezoelectric body 53 (frame body layer forming step). FIG. 5C shows the cross-sectional view in a state where the steps so far are completed.

Figure 6A:
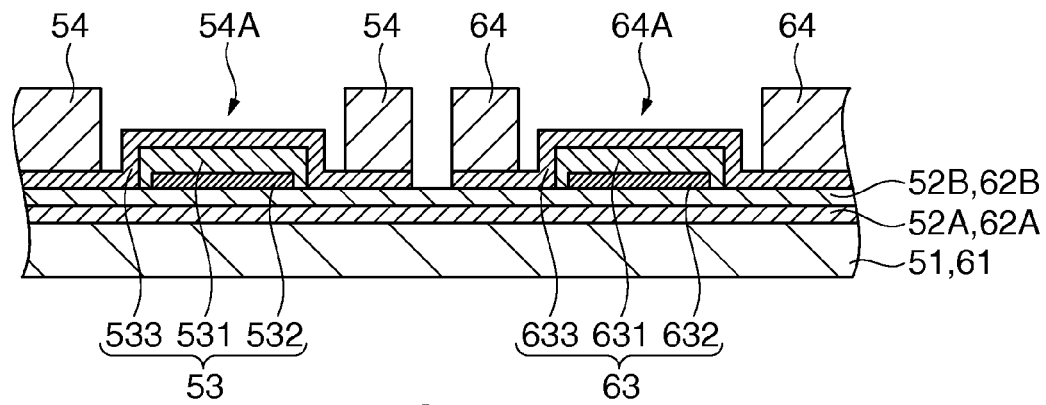
FIGS. 6A to 6C show manufacturing steps of the sensor array.

Next, the frame body layer 70 coated on the upper electrodes 533 and 633 is exposed and developed by a photolithography method to pattern the frame body layer 70 into a desired shape. In this step, the frame body 64 and the second frame body 54 which have the cavities 54A and 64A and are independent of each other are formed (frame body forming step). FIG. 6A shows the cross-sectional view in a state where the steps so far are completed.

Figure 6B:
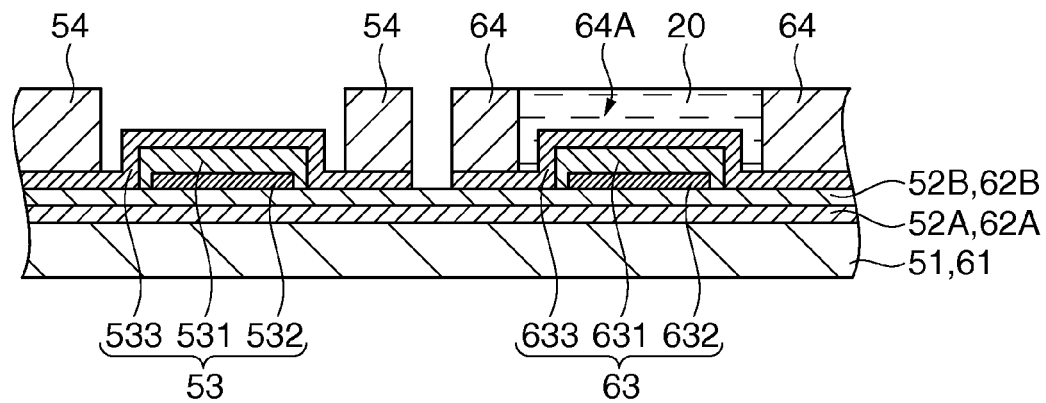

Next, the silicone oil 20 is filled in the cavity 64A of the frame body 64 of the pressure sensor 6 (filling step). FIG. 6B shows the cross-sectional view in a state where the steps so far are completed.

Figure 6C:
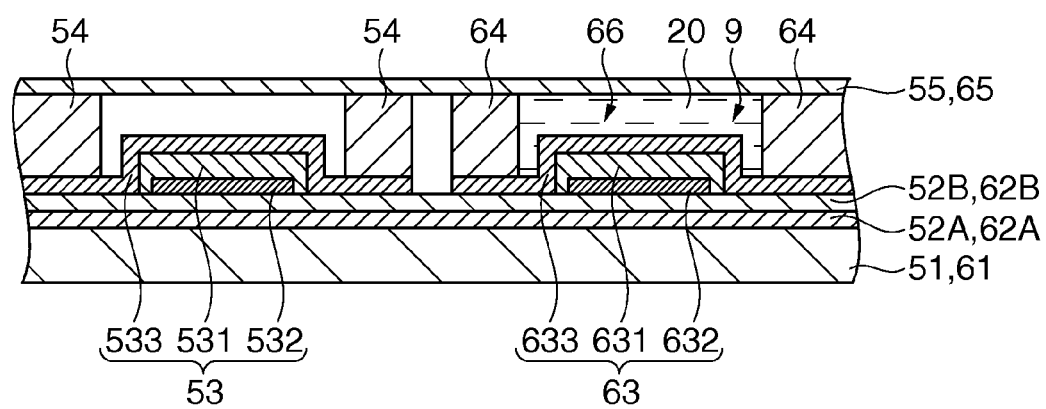

Next, a dry film resist corresponding to the protective film 55 and the sealing film 65 is coated on the upper surface of the frame body 64 and the second frame body 54 using a roll coating apparatus (film forming step). With this step, the inner space 66 is formed. FIG. 6C shows the cross-sectional view in a state where the steps so far are completed.

Next, the dry film resist corresponding to the protective film 55 and the sealing film 65 is exposed and developed by a photolithography method to pattern the protective film 55 and the sealing film 65 into a desired shape. FIG. 7A shows the cross-sectional view in a state where the steps so far are completed.

Next, the lower surface side of the common supporting body 51, 61 is dry etched to form the opening 61A and the second opening 51A having substantially the same dimensions as the inner diameter dimensions of the frame body 64 and the second frame body 54.

Through the steps described above, the sensor array 4 including the plurality of ultrasonic sensors 5 and the plurality of pressure sensors 6 on the common supporting body 51, 61, shown in FIG. 7B, is formed.

According to the pressure sensor 6, the sensor array 4, and the method for manufacturing the sensor array 4 of the embodiment described above, the following advantageous effects are provided.

As shown in FIG. 3B, the piezoelectric body 63 of the membrane 8 is contained in the frame body 64, and the silicone oil 20 which disperses a force is filled in the inner space 66 of the frame body 64. The frame body 64 is sealed by the sealing film 65. According to this configuration, when the arms 3 of the grasping apparatus 1 grasp the object 10, the object 10 abuts on the sealing film 65, and a force in this state is transmitted to the membrane 8 via the silicone oil 20. That is, since the object 10 does not directly contact the piezoelectric film 631 and a force when the object 10 contacts the sealing film 65 is transmitted to the membrane 8 via the silicone oil 20, the dispersed force is applied to the diaphragm portion 67 of the membrane 8 which detects pressure. Accordingly, the local application of force to the diaphragm portion 67 can be prevented, which can prevent the breakage of the membrane 8.

As shown in FIG. 3B, since the frame body 64 is formed of a permanent resist made of a synthetic resin having flexibility, the frame body 64 contracts when a force is applied to the frame body 64. The force is transmitted to the diaphragm portion 67 of the membrane 8 via the silicone oil 20 filled in the inner space 66 of the frame body 64, so that pressure can be favorably detected.

As shown in FIG. 2, the sensor array 4 includes two kinds of sensors, the pressure sensor 6 and the ultrasonic sensor 5. Therefore, the grasping apparatus 1 including the sensor array 4 can recognize the object 10 by the ultrasonic sensor 5 and detect pressure in a state where the arms 3 grasp the object 10 by the pressure sensor 6.

As shown in the method for manufacturing the sensor array, since it is only necessary for the ultrasonic sensor 5 to be configured of the constituent members constituting the pressure sensor 6 excepting the silicone oil 20 and the sealing film 65, the ultrasonic sensor 5 can be manufactured easily. That is, the ultrasonic sensor 5 can be manufactured in the course of manufacturing the pressure sensor 6. Accordingly, the manufacturing steps of the sensor array 4 can be simplified, which can reduce the manufacturing cost.

In the case of configuring a sensor array having a portion where only the pressure sensor 6 is formed or a portion where only the ultrasonic sensor 5 is formed, a position at which the ultrasonic sensor 5 recognizes the object 10 sometimes differs from a position at which the pressure sensor 6 detects a force grasping the object 10, which may cause a variation between detected positions of the sensors 5 and 6.

In the embodiment, on the other hand, since the pressure sensors 6 and the ultrasonic sensors 5 are arranged at equal distances from each other as shown in FIG. 2, a variation does not occur between the position at which the ultrasonic sensor 5 recognizes the object 10 and the position at which the pressure sensor 6 detects the force grasping the object 10.

Since the ultrasonic sensor 5 and the pressure sensor 6 are arranged independently of each other, the transmission of vibrations of the membrane 8 of the ultrasonic sensor 5 to the pressure sensor 6 can be suppressed. That is, since the influence of vibrations from the ultrasonic sensor 5 on the piezoelectric body 63 or the diaphragm portion 67 of the membrane 8 of the pressure sensor 6 is reduced, the pressure sensor 6 can detect pressure with good accuracy.

Hereinafter, another embodiment (second embodiment) according to the invention will be described based on the drawings.

Second Embodiment

Configuration of Sensor Array

Figure 9:
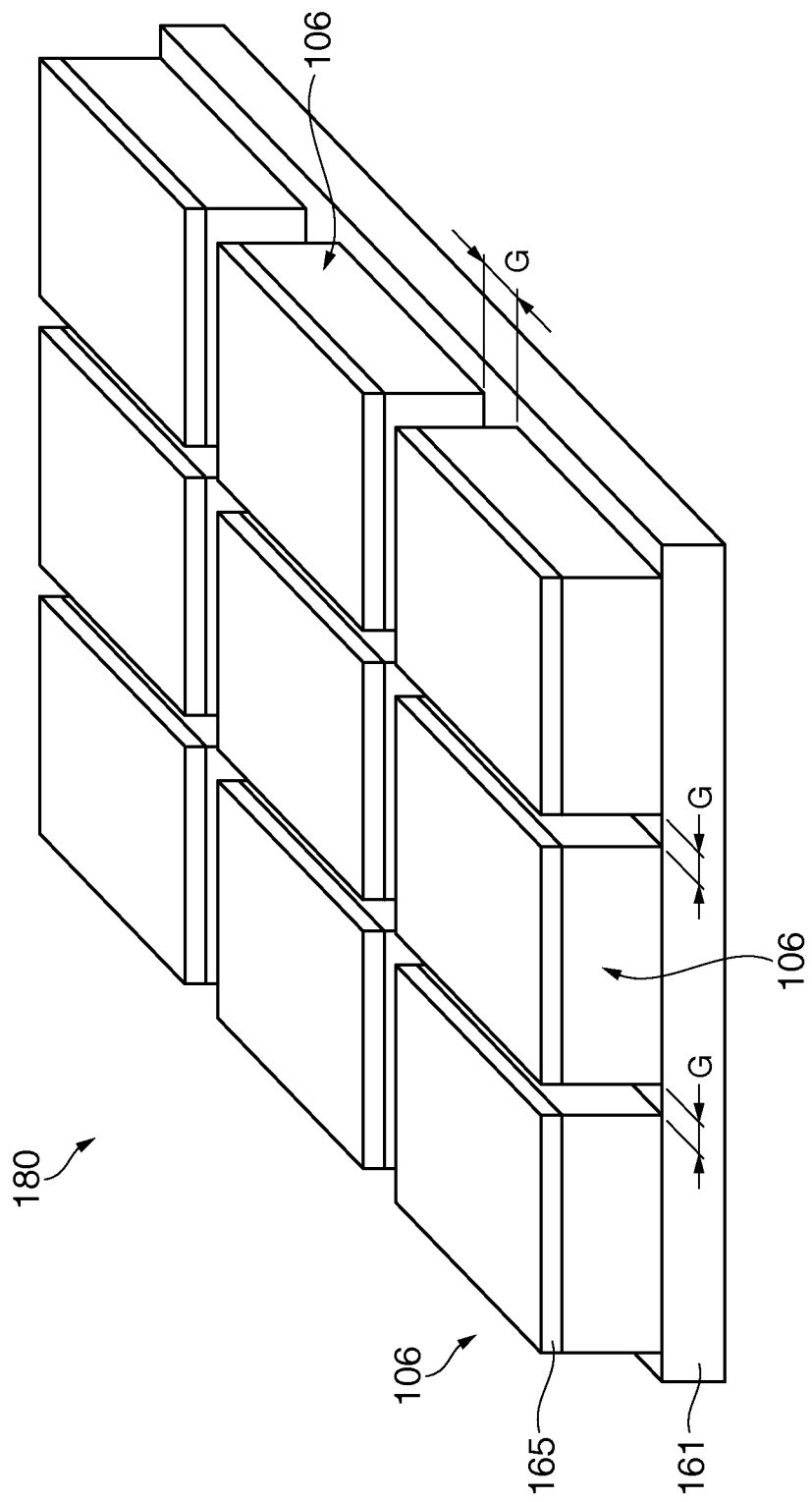
FIG. 9 is a perspective view showing a sensor array.
Figure 10A:
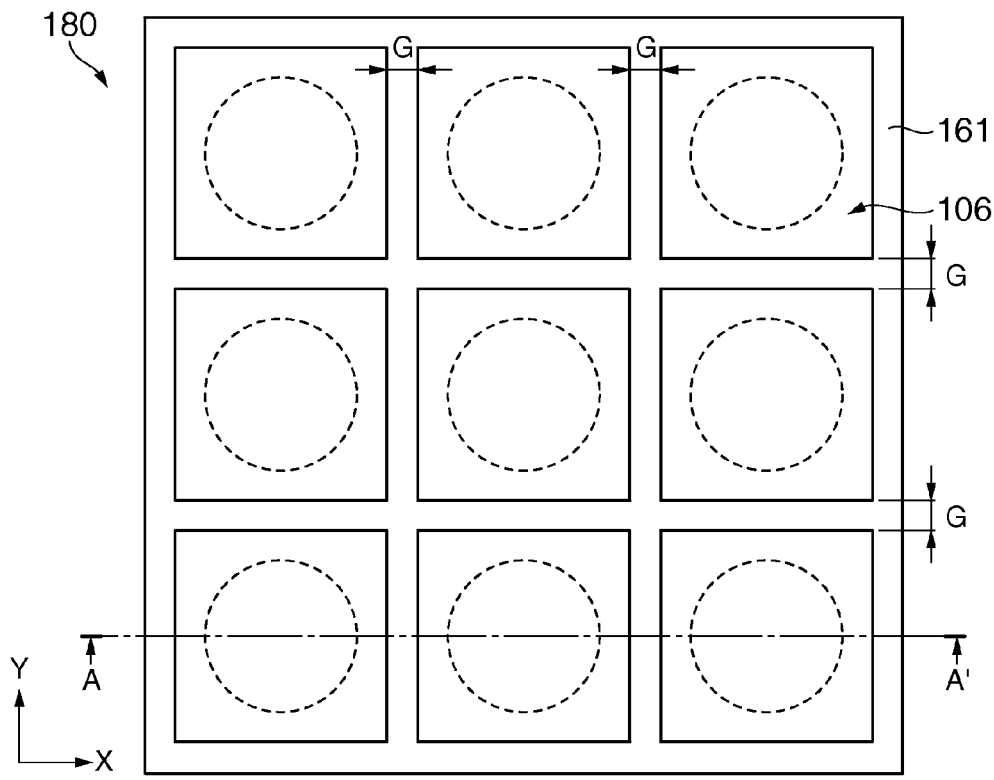
FIGS. 10A, 10B, and 10C are a plan view and cross-sectional views, respectively, showing the sensor array.
Figure 10B:
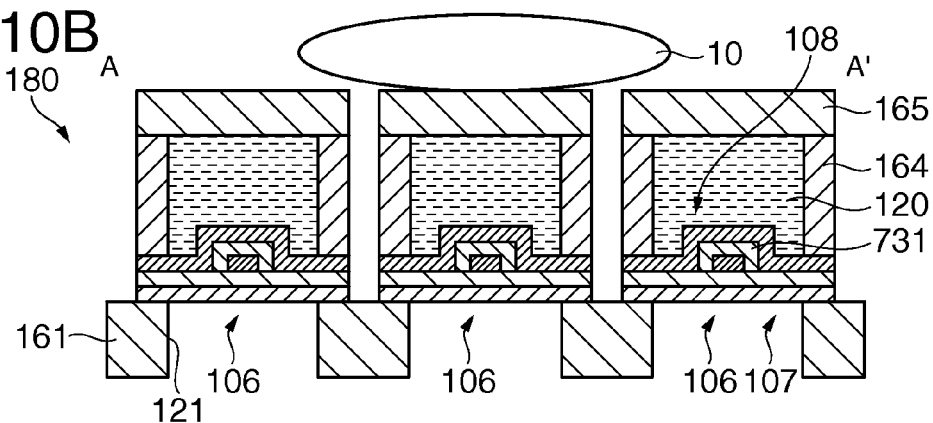

FIG. 9 is a perspective view showing a sensor array 180 according to the second embodiment. FIG. 10A is a plan view of the sensor array 180 shown in FIG. 9; FIG. 10B is a cross-sectional view taken along line A-A' shown in FIG. 10A when the object 10 contacts the sensor array; and FIG. 10C is a cross-sectional view taken along the line A-A' when a greater pressure than usual is applied in a state of grasping the object 10.

Figure 10C:
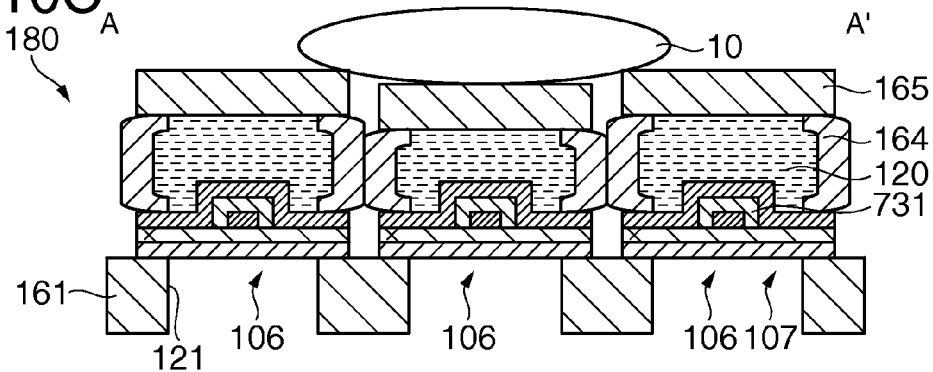

The sensor array 180 is, for example, a tactile sensor having excellent resistance to pressure and outputs, as an electric signal, pressure between the object 10 and the sensor array 180 as shown in FIGS. 10A to 10C. The sensor array 180 includes a plurality of pressure sensors 106 which are mounted on a supporting body 161. The sensor array 180 differs from the sensor array of the first embodiment in that a groove G as a gap is arranged so that when a smaller pressure than an allowable pressure of the pressure sensor 106, near the allowable pressure, is applied, frame bodies of the pressure sensors 106 next to each other are pushed (contacted) to each other to thereby function as each other's reinforcing materials. Other than these points, the sensor array 180 is similar to that described in the first embodiment. For example, the groove G may be formed only at a portion between the pressure sensors 106.

The pressure sensor 106 has the structure shown in "Configuration of Pressure Sensor" described above. That is, in FIG. 10B, since a membrane 108 is subjected to pressure via a silicone oil 120 with a top of the pressure sensor 106 being as a pressure-sensitive surface (abutment surface), an impact from the object 10 can be dispersed over the entire membrane 108. Since the membrane 108 is protected from the concentration of pressure, the reliability of the pressure sensor 106 can be improved.

The pressure sensor 106 performs the operation shown in "Operation of Pressure Sensor" described above. That is, a piezoelectric film 731 deflects by being subjected to pressure from the object 10, and voltage according to the deflection amount is generated. Thus, the pressure can be detected based on the voltage generated from the membrane 108.

As shown in FIGS. 9 and 10B, in the sensor array 180, the pressure sensors 106 each of which has a frame body 164 whose outer shape is a rectangle (square as an example in this case) are arranged, on a supporting body 161 which includes openings 121 and is provided in common to the plurality of pressure sensors, along a predetermined first direction (X-direction) and a second direction (Y-direction) perpendicular to the first direction (X-direction) with the grooves G all having the same width and each interposed between the pressure sensors. In other words, a gap for separating the frame bodies 164 from each other is formed between the frame bodies.

The width of the groove G will be described in "Operation of Sensor Array" described later.

The pressure sensors 106 are arranged to be separated from each other so that the supporting body 161 is exposed in the gap between the pressure sensors.

Although, in the preferred example shown in FIG. 9, the groove G is formed to the position of the surface of the supporting body 161, a structure in which a portion of the supporting body 161 is hollowed may be used. Especially when silicon is used for the supporting body 161 and silicon oxide or $ZrO_2$ is used for a supporting film 162, high shape reproducibility can be provided because a high selectivity is obtained when performing etching.

Moreover, a configuration having a groove G formed to such a depth that the supporting film. 162 is exposed may be used. In this case, especially when a permanent resist is used for the frame body 164, high shape reproducibility can be provided because etching is stopped by the supporting film 162. Moreover, since etching can be performed using a developer at the same time as when the frame body 164 is fabricated, the manufacturing steps can be shortened.

Moreover, it is allowed for the groove G to use a structure in which a frame body layer 170 made of a permanent resist used for forming the frame body 164 is thinly left at the bottom of the groove on the supporting body side. In this case, a processing method for obtaining the configuration described above is described. However, this does not intend to limit a processing method but is introduced as an example for obtaining the structure. Irrespective of a processing method, it is sufficient to have the shape described above. Moreover, the pressure sensors 106 may be divided into individual ones (edge cutting) and may be arranged again on a sensor substrate (not shown) which is prepared separately. Moreover, a sensor substrate may be bonded to the supporting body 161 and may be cut (edge cutting) to the supporting body 161. In this case, since interference between the pressure sensors 106 can be prevented, pressure can be measured with higher accuracy.

The term "edge cutting" as used herein includes, in addition to the case of complete separation, the case where the pressure sensors are not completely separated but connected to such an extent that they do not cause functional interference.

Operation of Sensor Array

Next, the operation of the sensor array 180 will be described with reference to FIGS. 1 and 10A to 10C. The sensor array 180 (not shown in FIG. 1) is described as being bonded to the grasping surface 31 in this case.

First, when the object 10 contacts the grasping surface 31 as shown in FIG. 10B, the pressure sensor 6 detects pressure given to the object 10. By applying pressure from the grasping surface 31 to the object 10, the object 10 is grasped.

When too much stress is applied to the pressure sensor 106, the pressure sensor 106 may be excessively collapsed and deteriorated. When excessive pressure is applied to the pressure sensor 106, the frame body 164 deforms such that the central portion expands more than both ends with respect to the height direction of the frame body, the region formed by separation with the groove G is filled, and the frame body 164 and the frame body of the next pressure sensors 106 are pushed to each other. As shown in FIG. 10C, therefore, the pressure sensors 106 next to each other function as each other's reinforcing materials, which can prevent the deterioration of the pressure sensor 106 caused by excessive collapse. In other words, the width of the groove G is preferably such a width that the frame bodies 164 contact each other when pressure less than a breaking strength is applied.

Method for Manufacturing Sensor Array

Next, a method for manufacturing the sensor array 180 including the pressure sensors 106 will be described.

FIGS. 11A to 12D are step cross-sectional views for explaining manufacturing steps for manufacturing the plurality of pressure sensors 106.

Figure 11A:
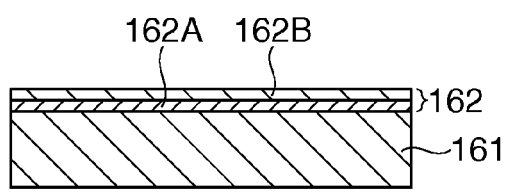
FIGS. 11A to 11H are step cross-sectional views for explaining manufacturing steps of the sensor array.

First, a single-crystal silicon substrate which serves as the supporting body 161 (a thickness of about 650 μm) is prepared, and the surface of the substrate is thermally oxidized, so that a first oxide film 162A formed of SiO$_2$ is formed so as to have a thickness of about 1 μm. By depositing Zr by sputtering and thermally oxidizing the same, ZrO$_2$ is formed on the first oxide film 162A. A second oxide film 162B formed of ZrO$_2$ is formed so as to finally have a thickness of about 3 μm, whereby the supporting film 162 is formed. FIG. 11A shows the step cross-sectional view in a state where the step so far is completed.

In this case, when the groove G is formed to a portion of the supporting body 161 between the pressure sensors 106, a step of forming the groove G is preferably performed in this state where the supporting film 162 is formed, in view of the manufacturing steps. In the embodiment, the case of using, in a later step than this step, the step of forming the groove G by which the supporting body 161 is exposed and the supporting film 162 is divided will be described. The groove G is formed at a position overlapping with the gap between the pressure sensors 106.

Next, in an argon gas atmosphere under a predetermined pressure, a conductor film constituting a lower electrode 732 is formed so as to cover the second oxide film 162B using sputtering deposition. A not-shown photoresist is coated on the surface side of the supporting body 161 where the supporting film 162 is formed, and exposed and developed by a photolithography method. Further by an etching process, the lower electrode 732 is patterned.

Figure 11E:
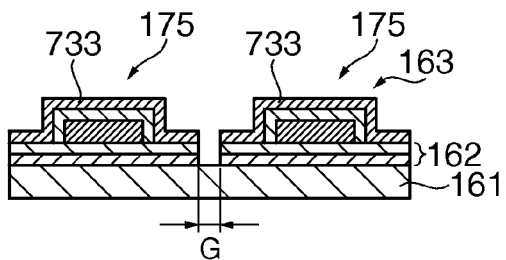
Figure 11B:
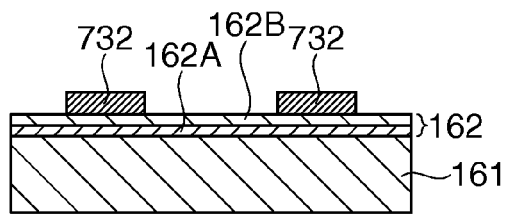

FIG. 11B shows the step cross-sectional view in a state where the steps so far are completed.

Next, a film for forming the piezoelectric film 731 is deposited by sputtering so as to cover the lower electrode 732. By a photolithography method and an etching process, the piezoelectric film 731 is patterned. The piezoelectric film 731 functions as a pressure detecting portion.

Figure 11F:
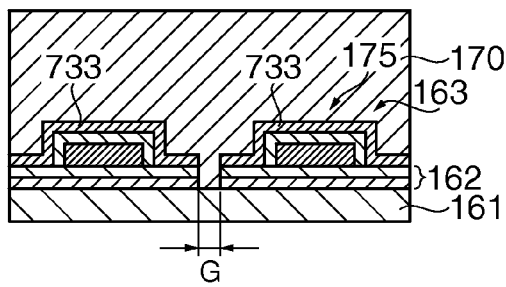
Figure 11C:
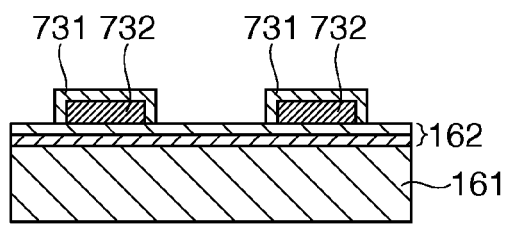

FIG. 11C shows the step cross-sectional view in a state where the steps so far are completed.

Next, on the surface side of the supporting body 161 where the lower electrode 732 is arranged, a conductor film constituting an upper electrode 733 is deposited by a sputtering method. By a photolithography method and an etching process, the upper electrode 733 is patterned to form a plurality of island-like piezoelectric bodies 163. Thus, island-like pressure detecting portions 175 (including the supporting film 162 and the piezoelectric body 163) are formed. The term "island-like pressure detecting portion" as used herein means that the shape of a region where four layers of the supporting film, the lower electrode, the piezoelectric film, and the upper electrode are stacked is an independent island-like shape (pressure detecting portion forming step). Next, the groove G which divides the supporting film 162 is formed (groove forming step).

Figure 11G:
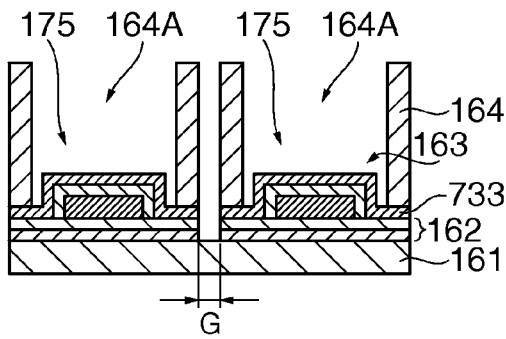
Figure 11D:
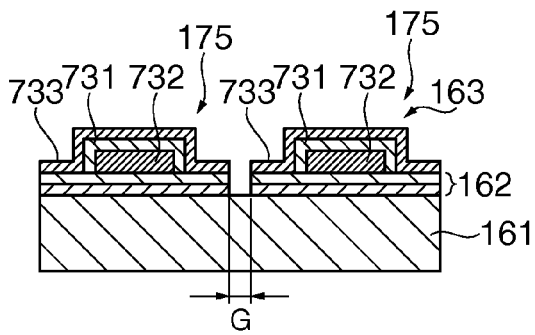

FIG. 11D shows the step cross-sectional view in a state where the steps so far are completed.

Next, the supporting body 161 is grinded by, for example, back grinding (BG) so that the thickness is reduced to about 200 μm. This is because when the supporting body 161 which has been grinded to a desired thickness dimension is prepared in the steps so far, the supporting body 161 may be warped during the manufacturing steps.

FIG. 11E shows the step cross-sectional view in a state where the steps so far are completed.

Next, a permanent resist is coated as the frame body layer 170 on the upper electrodes 733 using a spin coating apparatus or a squeegee. Thus, the frame body layer 170 is formed so as to cover the piezoelectric bodies 163 (frame body layer forming step).

FIG. 11F shows the step cross-sectional view in a state where the steps so far are completed.

If the groove G is formed in a step after forming the frame body layer 170, the frame body layer 170 may be damaged. Therefore, the groove G is preferably formed in the steps so far. Specifically, the groove G may be processed such that a region whose thickness is thin is provided between the frame bodies 164 next to each other using the same material as the frame body 164, that a region where the piezoelectric body 163 is exposed is provided between the frame bodies 164 next to each other, that a region where the supporting body 161 is exposed is provided between the frame bodies 164 next to each other (in the case of the embodiment), or that a region where the supporting body 161 is exposed and further the supporting body 161 is hollowed is provided between the frame bodies 164 next to each other. If the damage of the frame body layer 170 can be prevented even when the groove G is formed, the step of forming the groove G may be performed in a later step.

The frame body layer 170 (permanent resist) coated on the upper electrodes 733 is exposed and developed by a photolithography method to pattern the frame body layer 170 such that the outer shape of a region to serve as the frame body 164 of the frame body layer 170 is a rectangle (square as an example in this case) as shown in FIGS. 10A to 10C, and to pattern the frame body layer 170 so as to form a cavity 164A to expose a detecting portion 175 inside the region to serve as the frame body 164, whereby the plurality of frame bodies 164 are formed (frame body forming step). FIG. 11G shows the step cross-sectional view in a state where the steps so far are completed.

In the cavity 164A of the frame body 164, the silicone oil 120 as a pressure medium is filled (filling step). Any material can be used for this as long as the material disperses pressure. Other than the silicone oil 120, for example, a silicone rubber, a polymer gel, a synthetic gel, a natural gel, a polymer resin, or the like may be used.

Figure 11H:
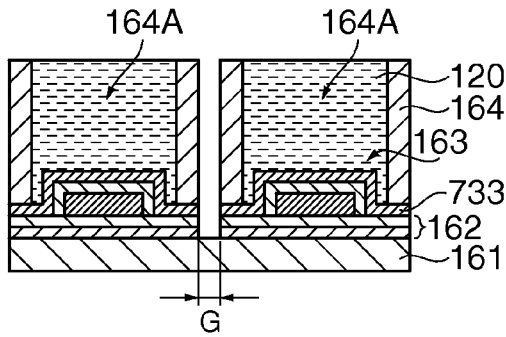

FIG. 11H shows the step cross-sectional view in a state where the steps so far are completed.

Figure 12A:
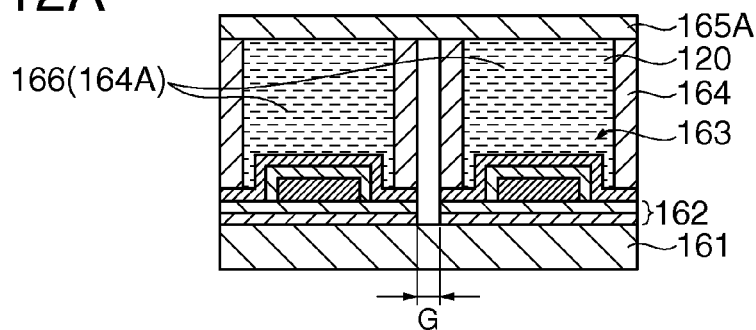
FIGS. 12A to 12D are step cross-sectional views for explaining manufacturing steps of the sensor array.

Next, a dry film resist 165A is coated as a sealing film on the upper surface of the frame body 164 by a roll coating apparatus (film forming step). Thus, the cavity 164A is sealed to serve as an inner space 166. FIG. 12A shows the step cross-sectional view in a state where the steps so far are completed.

In this case, for coating without including air bubbles, coating is preferably performed in a reduced-pressure atmosphere. Moreover, for closely adhering the resist 165A, coating is preferably performed while heating.

Figure 12B:
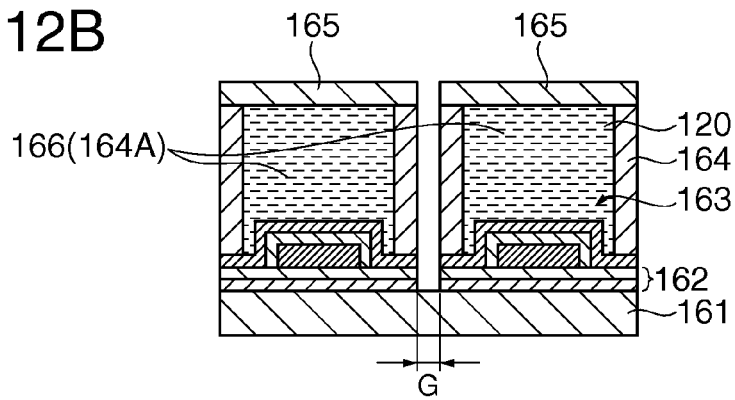

Next, patterning is performed so as to leave the resist 165A located at a region overlapping with the frame body 164 and inside the frame body 164, whereby a sealing film 165 as a pressure-sensitive film serving as a pressure-sensitive surface is formed. FIG. 12B shows the step cross-sectional view in a state where the steps so far are completed.

Figure 12C:
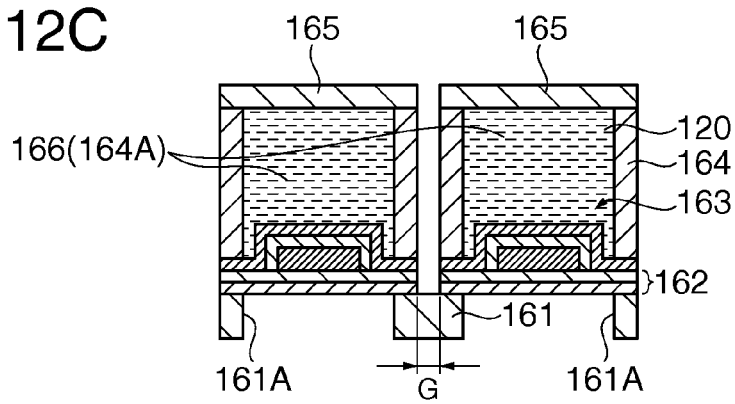
Figure 12D:
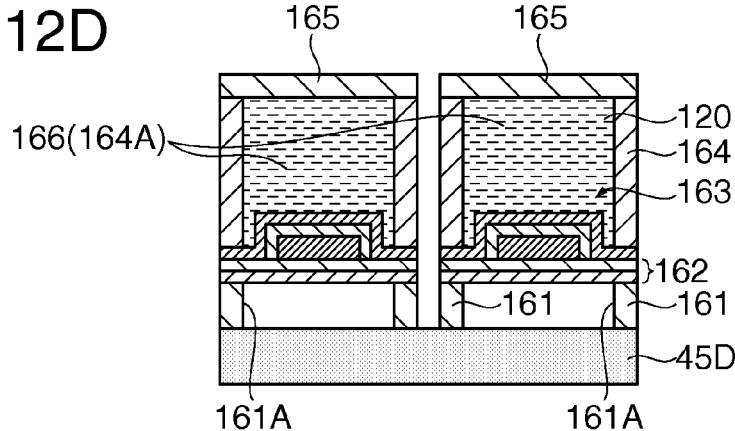

Next, the surface (back surface) of the supporting body 161 where the supporting film 162 is not present is dry etched such that, in plan view of the supporting body 161, an opening is substantially overlapped with an opening inside the frame body 164. Then, an opening 161A is formed so as to substantially overlap with the opening inside the frame body 164. FIG. 12C shows the step cross-sectional view in a state where the steps so far are completed.

By completing the steps so far, the sensor array 180 including the pressure sensors 106 is formed.

In addition to the steps of the manufacturing method described above, a step of bonding a sensor substrate 45D to the supporting body 161, cutting the supporting body 161, and separating the pressure sensors 106 may be added. In this case, a structure shown in FIG. 12D can be obtained. That is, the pressure sensor 106 is supported by the sensor substrate 45D.

Moreover, the supporting body 161 may be first cut and then bonded to the sensor substrate 45D.

According to the configuration of the pressure sensor 106, the configuration of the sensor array 180, and the method for manufacturing the sensor array 180 of the embodiment described above, the following advantageous effects can be obtained.

When excessive pressure is applied to the pressure sensor 106, the frame body 164 deforms such that the central portion expands more than both ends with respect to the height direction of the frame body, the groove G is filled, and the frame body 164 and the frame body of the next pressure sensor 106 are pushed to each other. As shown in FIG. 10C, therefore, the pressure sensors 106 next to each other function as each other's reinforcing materials, which can prevent the deterioration of the pressure sensor 106 caused by excessive collapse.

The pressure sensors 106 each of which has the frame body 164 whose outer shape is a rectangle (square as an example in this case) are arranged along the predetermined first direction (X-direction) and the second direction (Y-direction) perpendicular to the first direction (X-direction) with the grooves G all having the same value. Therefore, when excessive pressure is applied to the pressure sensors 106, the frame bodies 164 next to each other are pushed to each other at a plane. Therefore, compared to the case where the outer shape of the frame body 164 is, for example, circular or the like, since the frame bodies 164 next to each other are pushed to each other at a plane, resistance to high pressure can be further improved, making it possible to provide the sensor array 180 with high reliability.

After performing the manufacturing process to a certain extent, the step of grinding the supporting body 161 by, for example, back grinding (BG) so that the thickness is reduced to about 200 μm is used. Therefore, it is possible to suppress the occurrence of such a defect that the supporting body 61 is warped during the manufacturing steps.

Hereinafter, still another embodiment (third embodiment) according to the invention will be described based on the drawings.

Third Embodiment

Configuration of Sensor Array

Figure 13:
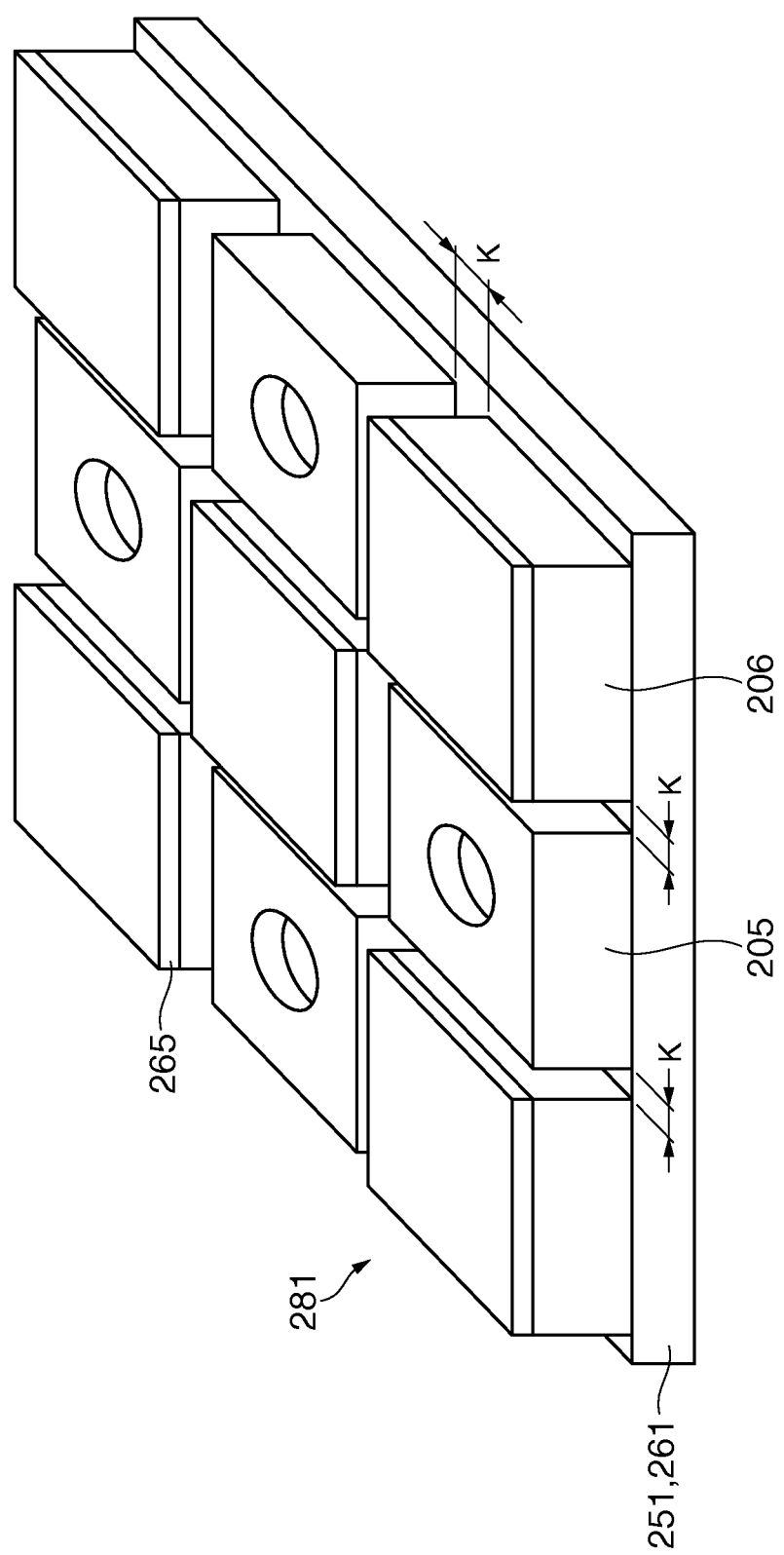
FIG. 13 is a perspective view showing a sensor array.
Figure 14A:
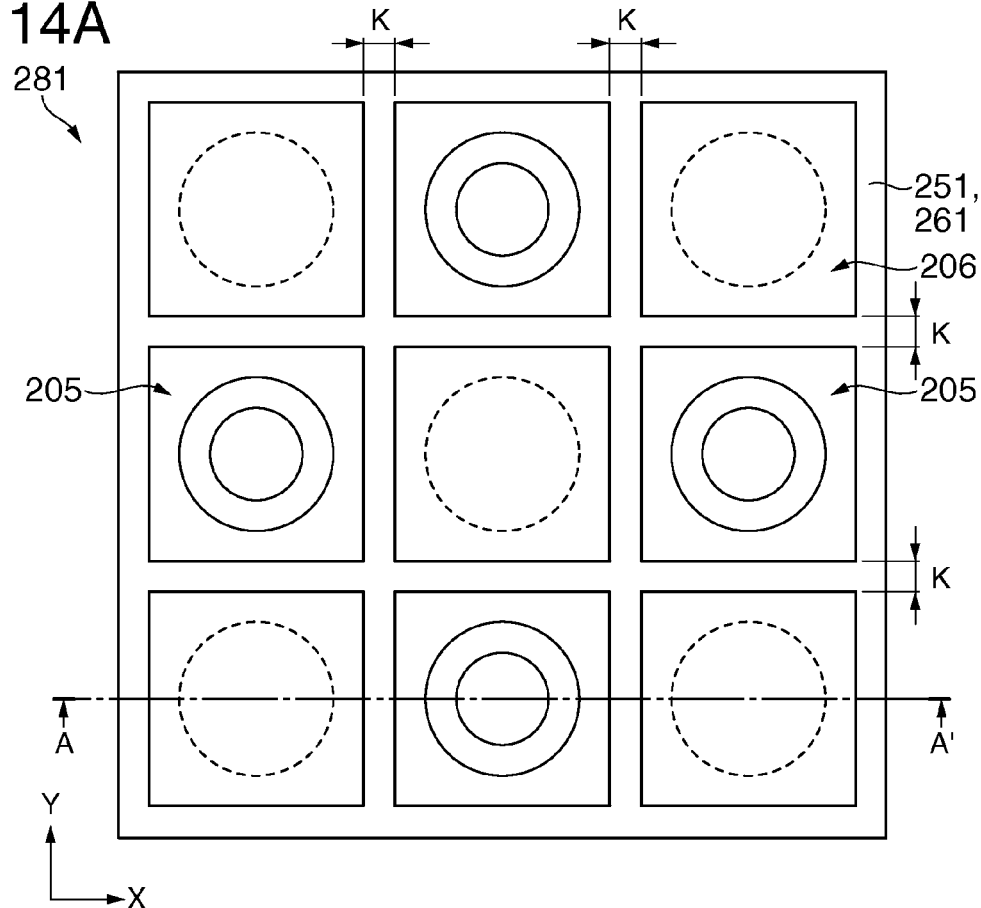
FIGS. 14A and 14B are a plan view and a cross-sectional view, respectively, showing the sensor array.
Figure 14B:
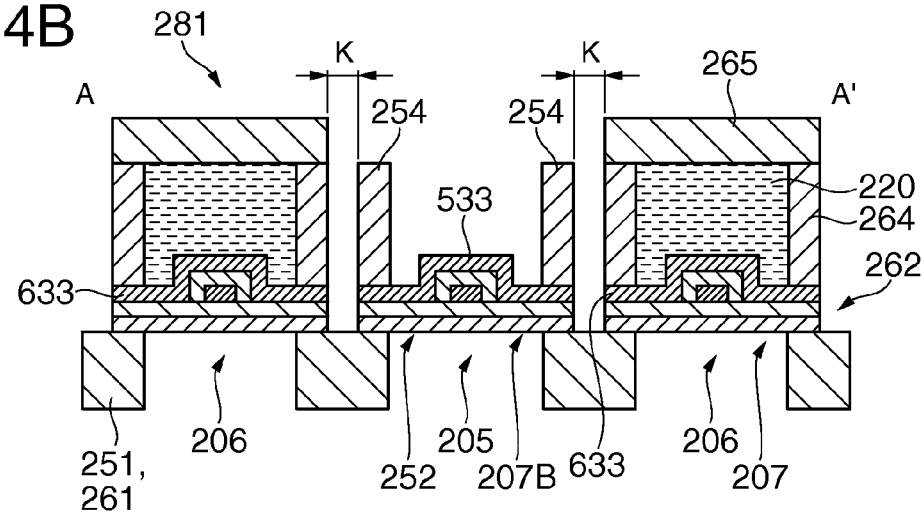

FIG. 13 is a perspective view showing a sensor array 281. FIG. 14A is a plan view of the sensor array 281 shown in FIG. 13; and FIG. 14B is a cross-sectional view taken along line A-A' of the plan view shown in FIG. 14A. The sensor array 281 includes ultrasonic sensors 205 in addition to pressure sensors 206.

The sensor array 281 is, for example, a tactile sensor which can detect distance information and pressure information. The sensor array 281 includes the plurality of ultrasonic sensors 205 each of which outputs distance information as an electric signal when the object 10 is away from the sensor array 281, and the plurality of pressure sensors 206 each of which outputs, as an electric signal, the pressure between the object 10 and the sensor array 281 when the object 10 contacts the sensor array 281. The sensor array 281 differs from the sensor array 180 in the second embodiment (for example, refer to FIGS. 10A and 10B) in including the plurality of ultrasonic sensors 205 in addition to the plurality of pressure sensors 206 mounted on a common supporting body 251, 261.

The sensor array 281 has such features that a top of the pressure sensor 206 based on the common supporting body 251, 261 is formed so as to be positioned high compared to a top of the ultrasonic sensor 205, and that the pressure sensor 206 and the ultrasonic sensor 205 are arranged via a groove K as a predetermined gap so that when a smaller pressure than an allowable pressure of the sensor array 281, near the allowable pressure, is applied, the pressure sensor 206 and the ultrasonic sensor 205 are pushed (contacted) to the next pressure sensor 206 or the next ultrasonic sensor 205 to thereby function as each other's reinforcing materials. Other than these points, the sensor array 281 is similar to those described in the first embodiment and the second embodiment. For example, the groove K may be formed only at a portion between the pressure sensor 206 and the ultrasonic sensor 205.

By including the ultrasonic sensor 205, even in a state where the arm 3 of the grasping apparatus 1 (refer to FIG. 1) is away from the object 10, the distance between the arm and the object 10 can be measured. Therefore, it is possible to grasp the object 10 with higher speed and precision. For example, since the distance between the arm and the object 10 can be measured, the arms 3 are moved at high speed until they contact the object 10, and a grasping state is maintained by the pressure sensors 206 after contact, thereby making it possible to grasp the object 10 in a state of maintaining the accuracy of grasping pressure.

The ultrasonic sensor 205 has the structure shown in "Configuration of Ultrasonic Sensor" described above. That is, as shown in FIG. 3A, the second diaphragm portion 57 which can perform free vibrations is provided, and the piezoelectric film 731 using PZT or the like is connected to the second diaphragm portion 57. The lower electrode 732 and the upper electrode 733 which apply voltage to the piezoelectric film 731 are provided.

The ultrasonic sensor 205 performs the operation shown in "Operation of Ultrasonic Sensor" described above. That is, a second diaphragm portion 207B is vibrated in a direction perpendicular to the plane direction of a second supporting film 252 by the application of voltage to transmit ultrasonic waves at a frequency according to a predetermined drive voltage cycle. By receiving reflected waves from the object 10 (refer to FIG. 1), the position of the object 10 is detected.

In the sensor array 281, on the integrated supporting body 251, 261, the ultrasonic sensors 205 and the pressure sensors 206 which have a second frame body 254 and a frame body 264, respectively, whose outer shape is a rectangle (square as an example in this case) are alternately arranged with a predetermined gap (width of the groove K) along a predetermined first direction (X-direction) and a second direction (Y-direction) perpendicular to the first direction (X-direction). The width of the groove K will be described in "Grasping Apparatus including Sensor Array" described later.

The ultrasonic sensor 205 is formed such that a top of the ultrasonic sensor 205 based on the common supporting body 251, 261 is positioned low by the thickness of a sealing film 265 compared to a top of the pressure sensor 206. In this case, the difference between the top positions is not essentially limited to the thickness of the sealing film 265, and an ultrasonic sensor 205 having a top lower than the top of the pressure sensor 206 may be provided.

The ultrasonic sensor 205 and the pressure sensor 206 are separately arranged so that the common supporting body 251, 261 is exposed in the gap between the ultrasonic sensor 205 and the pressure sensor 206.

Instead of having the shape of exposing a portion of the common supporting body 251, 261, a structure in which the common supporting body 251, 261 is hollowed may be used as a structure of the groove K. Especially when silicon is used for the common supporting body 251, 261 and silicon oxide or $ZrO_2$ is used for a common supporting film 252, 262, high shape reproducibility can be provided.

Moreover, a step of forming the groove K to such a depth that the common supporting film 252, 262 is exposed may be used. In this case, especially when a permanent resist is used for the frame body 264 and the second frame body 254, high shape reproducibility can be provided because etching is stopped by the common supporting film 252, 262. Moreover, since etching can be performed using a developer at the same time as when the frame body 264 and the second frame body 254 are fabricated, the manufacturing steps can be shortened.

Moreover, it is allowed for the groove K to use a structure in which a frame body layer 270 made of a permanent resist used for forming the frame body 264 and the second frame body 254 is thinly left at the bottom of the groove on the supporting body side. In this case, a processing method for obtaining the configuration described above is described. However, this does not intend to limit a processing method but is introduced as an example for obtaining the structure. Irrespective of a processing method, it is sufficient to have the shape described above.

Method for Manufacturing Sensor Array

Next, a method for manufacturing a sensor array will be described. In this case, the ultrasonic sensor 205 and the pressure sensor 206 are formed on the same substrate (the common supporting body 251, 261). FIGS. 16A to 17D are step cross-sectional views for explaining manufacturing steps of the sensor array.

Figure 16A:
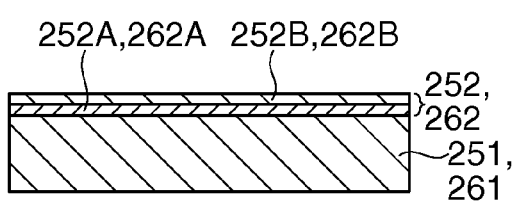
FIGS. 16A to 16G are step cross-sectional views for explaining manufacturing steps of the sensor array.

First, a single-crystal silicon substrate which serves as the common supporting body 251, 261 (a thickness of about 650 μm) is prepared, and the surface of the substrate is thermally oxidized, whereby the first oxide film 252A, 262A formed of $SiO_2$ is formed so as to have a thickness of about 1 μm. By depositing Zr by sputtering and thermally oxidizing the same, a second oxide film 252B, 262B formed of $ZrO_2$ is formed on the first oxide film 252A, 262A so as to have a thickness of about 3 μm, whereby the common supporting film 252, 262 is formed. FIG. 16A shows the step cross-sectional view in a state where the steps so far are completed.

When the groove K is formed to a portion of the common supporting body 251, 261 between the ultrasonic sensor 205 and the pressure sensor 206, a step of forming the groove K is preferably performed in this state where the common supporting film 252, 262 is formed, in view of the manufacturing steps. In the embodiment, the case of using, in a later step than this step, the step of forming the groove K to expose the common supporting body 251, 261 will be described.

Next, in an argon gas atmosphere under a predetermined pressure, a conductor film constituting lower electrodes 932 and 832 is formed so as to cover the second oxide film 252B, 262B using sputtering deposition. A photoresist is coated on the surface side of the common supporting body 251, 261 where the common supporting film 252, 262 is formed, is exposed and developed by a photolithography method, and is further patterned by an etching process to form the lower electrodes 932 and 832. This patterning is performed such that when a predetermined pressure equal to or less than an allowable pressure is applied to the pressure sensor 206, the groove K where the pressure sensor 206 contacts the next pressure sensor 206 or the next ultrasonic sensor 205 is obtained in the gap between the pressure sensors 206 as finished articles or the gap between the ultrasonic sensor 205 and the pressure sensor 206 as finished articles.

Figure 16E:
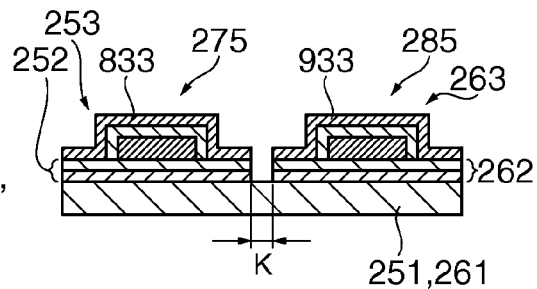
Figure 16B:
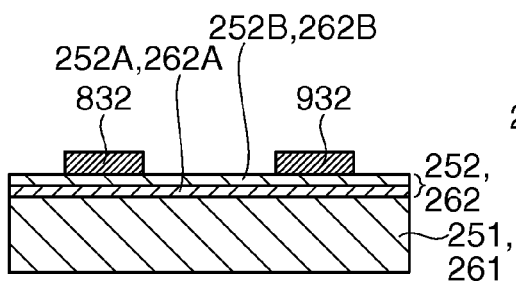

FIG. 16B shows the step cross-sectional view in a state where the steps so far are completed.

Next, a film for forming a piezoelectric film 931 and a second piezoelectric film 831 is deposited by sputtering so as to cover the lower electrodes 932 and 832. By patterning by a photolithography method and an etching process, the piezoelectric film 931 and the second piezoelectric film 831 are formed. The piezoelectric film 931 and the second piezoelectric film 831 function as a pressure detecting portion and an ultrasonic transducer portion, respectively.

Figure 16F:
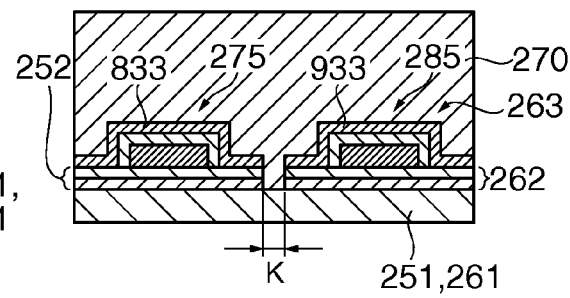
Figure 16C:
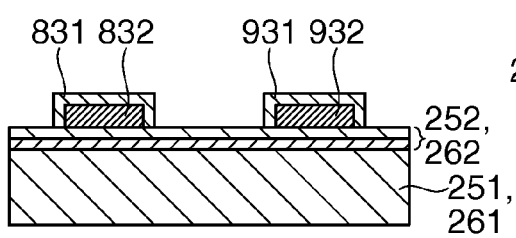

FIG. 16C shows the step cross-sectional view in a state where the steps so far are completed.

Next, on the surface side of the common supporting body 251, 261 where the lower electrodes 932 and 832 are arranged, a conductor film constituting upper electrodes 933 and 833 is deposited by sputtering. By patterning by a photolithography method and an etching process, the upper electrodes 933 and 833 are obtained, and a piezoelectric body 263 and a second piezoelectric body 253 each having an island-like shape are formed. Thus, a plurality of island-like ultrasonic transducer portions 275 (including the second supporting film 252 and the second piezoelectric body 253) and a plurality of island-like pressure detecting portions 285 (including the supporting film 262 and the piezoelectric body 263) are formed. The terms "island-like ultrasonic transducer portion" and "island-like pressure detecting portion" as used herein mean that the shape of a region where four layers of the supporting film, the lower electrode, the piezoelectric film, and the upper electrode are stacked is an independent island-like shape (piezoelectric body sensor portion forming step).

Next, the groove K which divides the common supporting film 252, 262 is formed (groove forming step).

Figure 16G:
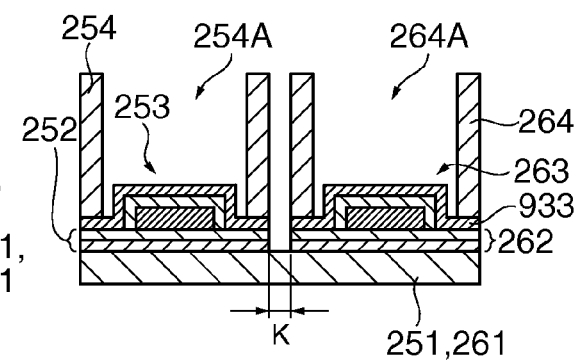
Figure 16D:
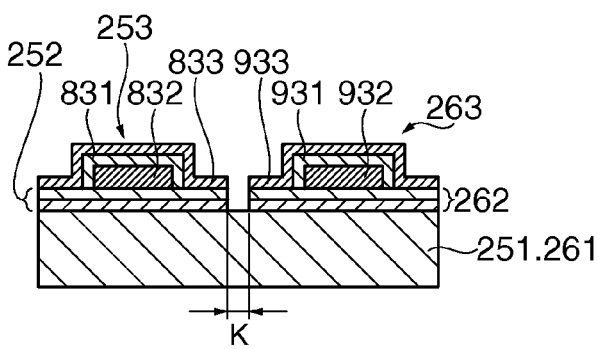

FIG. 16D shows the step cross-sectional view in a state where the steps so far are completed.

Next, the common supporting body 251, 261 is grinded by, for example, back grinding (BG) so that the thickness is reduced to about 200 μm. This is because when the common supporting body 251, 261 which has been grinded to a desired thickness dimension is prepared in the steps so far, the common supporting body 251, 261 may be warped during the manufacturing steps.

FIG. 16E shows the step cross-sectional view in a state where the steps so far are completed.

Next, a permanent resist is coated as a frame body layer 270 on the upper electrodes 933 and 833 using a spin coating apparatus or a squeegee and dried. Thus, the frame body layer 270 is formed so as to cover the piezoelectric body 263 and the second piezoelectric body 253 (frame body layer forming step).

FIG. 16F shows the step cross-sectional view in a state where the steps so far are completed.

If the groove K is formed in a step after forming the frame body layer 270, the frame body layer 270 may be damaged. Therefore, the groove K is preferably formed in the steps so far. Specifically, the groove K includes a region which is formed using the same material as the frame body layer 270 and whose thickness is thin between the frame body 264 and the second frame body 254 next to each other. Alternatively, the groove K may include a region where the piezoelectric body 263 and the second piezoelectric body 253 are exposed between the frame body 264 and the second frame body 254 next to each other. Alternatively, the groove K may include a region where the common supporting body 251, 261 is exposed between the frame body 264 and the second frame body 254 next to each other (the case of the embodiment). Alternatively, the groove K may be processed so as to include a region where the common supporting body 251, 261 is exposed and further the common supporting body 251, 261 is hollowed between the frame body 264 and the second frame body 254 next to each other. If the damage of the frame body layer 270 can be prevented even when the groove K is formed, the step of forming the groove K may be performed in a later step.

The frame body layer 270 formed on the upper electrodes 833 and 933 is exposed and developed by a photolithography method to pattern the frame body layer 270 such that the outer shape of the regions to serve as the frame body 264 and the second frame body 254 of the frame body layer 270 is a rectangle (square as an example in this case), and to pattern the frame body layer 270 so as to form a cavity 254A and a cavity 264A to expose the ultrasonic transducer portion 275 and the pressure detecting portion 285 inside the regions to serve as the frame body 264 and the second frame body 254, whereby a plurality of frame bodies 264 and second frame bodies 254 are formed (frame body forming step). FIG. 16G shows the step cross-sectional view in a state where the steps so far are completed.

Next, in the cavity 264A of the frame body 264 which finally serves as the pressure sensor 206, a silicone oil 220 is filled (filling step). In this case, the silicone oil 220 is not filled in the cavity 254A of the second frame body 254 which finally serves as the ultrasonic sensor 205. FIG. 17A shows the step cross-sectional view in a state where the steps so far are completed.

Next, a dry film resist is coated as a sealing film 265A on the upper surface of the frame body 264 and the second frame body 254 by a roll coating apparatus (film forming step). Thus, the cavity 264A is sealed to serve as an inner space 266. In this case, for coating without including air bubbles, coating is preferably performed in a reduced-pressure atmosphere. Moreover, for closely adhering the resist 265A, coating is preferably performed while heating. It is not necessary to form the sealing film 265A for the second frame body 254. However, since it is technically difficult to selectively form a dry film resist as the sealing film 265A using a roll coating apparatus, such a process that the sealing film 265A is once formed and then removed is performed as will be described later.

FIG. 17B shows the step cross-sectional view in a state where the steps so far are completed.

Next, patterning is performed so as to leave the sealing film 265 located at a region overlapping with the frame body 264 and inside the frame body 264 to selectively remove the sealing film 265A. FIG. 17C shows the step cross-sectional view in a state where the steps so far are completed.

Next, the surface (back surface) of the common supporting body 251, 261 on the side where the second supporting film 252 and the supporting film 262 are not present is dry etched such that, in plan view of the common supporting body 251, 261, openings are substantially overlapped with the openings inside the frame body 264 and the second frame body 254. Then, a second opening 251A and an opening 261A having substantially the same dimensions as the inner diameter dimensions of the frame body 264 and the second frame body 254 are formed so as to overlap with the openings inside the frame body 264 and the second frame body 254, whereby the ultrasonic sensor 205 and the pressure sensor 206 are formed. FIG. 17D shows the step cross-sectional view in a state where the steps so far are completed.

By completing the steps so far, the sensor array 281 is formed.

After completing the manufacturing steps described above, a sensor substrate (not shown) may be bonded to the common supporting body 251, 261 side, and the common supporting body 251, 261 positioned in the gap between the pressure sensors 206, the gap between the ultrasonic sensors 205, and the gap between the pressure sensor 206 and the ultrasonic sensor 205 may be cut by means such as etching. In this case, the transmission of vibrations is suppressed between the pressure sensor 206 and the ultrasonic sensor 205 by the sensor substrate. Therefore, the sensor array 281 which can precisely measure pressure is obtained.

Grasping Apparatus Including Sensor Array

Figure 22:
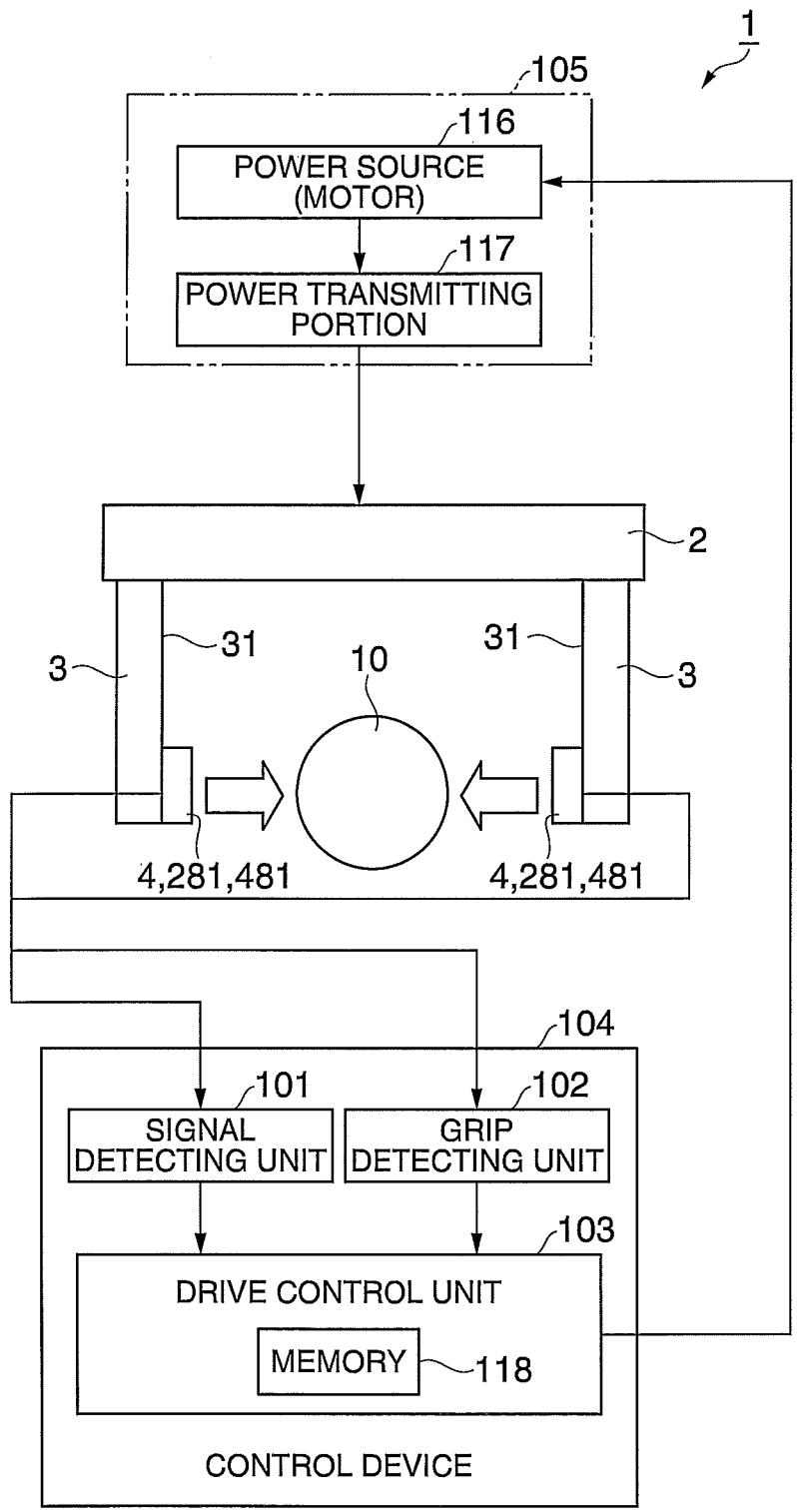
FIG. 22 is a block diagram for explaining a grasping operation of the grasping apparatus.
Figure 23:
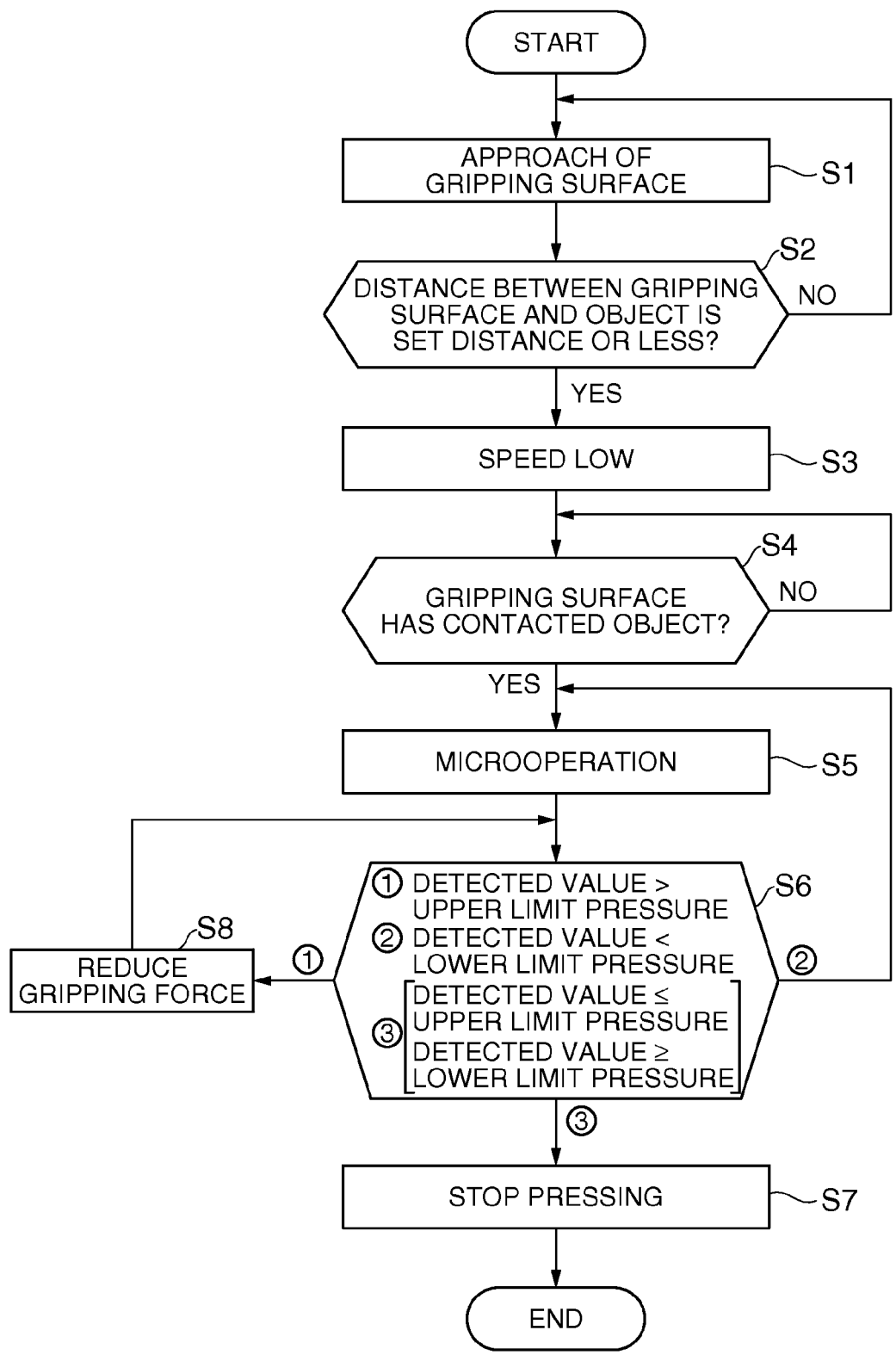
FIG. 23 is a flowchart for explaining the grasping operation of the grasping apparatus.

Next, the operation of the grasping apparatus 1 including the sensor array 281 will be described using FIGS. 22 to 24. FIG. 22 is a block diagram for explaining a grasping operation of the grasping apparatus 1; FIG. 23 is a flowchart for explaining the grasping operation of the grasping apparatus 1; and FIGS. 24A to 24C are timing diagrams for explaining the grasping operation of the grasping apparatus 1.

FIG. 22 is a block diagram where a control device and a drive mechanism block of the grasping apparatus 1, which are not shown in FIG. 1, are additionally illustrated. Similarly to the illustration in FIG. 1, the grasping apparatus 1 includes the supporting member 2 and the pair of arms 3 as grasping arms which extend from the supporting member 2. The arms 3 grasp the object 10. On the grasping surface 31 with which the arm 3 contacts the object 10, any of the sensor array 4 (refer to FIG. 2), the sensor array 281 (refer to FIG. 13), and a sensor array 481 (refer to FIG. 20) may be attached. In the embodiment, the case where the sensor array 281 is attached will be described.

As shown in FIG. 22, the grasping apparatus 1 includes a control device 104 for drivingly controlling the arms 3, and a drive mechanism 105.

The control device 104 includes a signal detecting unit 101, a grasp detecting unit 102, and a drive control unit 103.

The signal detecting unit 101 detects a distance signal from, for example, the ultrasonic sensor 205 (refer to FIGS. 14A and 14B) when the object 10 is away from the sensor array 281.

The grasp detecting unit 102 detects a pressure signal from the object 10 and the pressure sensor 206 (refer to FIGS. 14A and 14B) of the sensor array 281 provided on the grasping surface 31.

In the embodiment, the signal detected from the signal detecting unit 101 and the signal detected from the grasp detecting unit 102 are transmitted to the drive control unit 103. When the object 10 is away from the sensor array 281, the signal detected from the signal detecting unit 101 (the ultrasonic sensor 205) is transmitted to the drive mechanism 105 described later. When the object 10 is in contact with the sensor array 281, the pressure signal detected from the grasp detecting unit 102 (for example, the pressure sensor 206) is transmitted from the drive control unit 103 to the drive mechanism 105. Although, in this case, an example in which the distance signal and the pressure signal are output as digital signals is shown, also analog signal output can be similarly processed. For example, control may be performed using an OP amplifier or the like, or signals may be processed by AD conversion.

The drive mechanism 105 includes a power source 116 and a power transmitting portion 117.

The power source 116 is, for example, a motor. To the motor, a signal (control signal) for controlling the rotational speed is transmitted from the drive control unit 103. When it is sufficient that the object 10 and the sensor array 281 satisfy a poor positional accuracy (they are sufficiently away from each other), a signal to keep the rotational speed of the motor constant is transmitted from the drive control unit 103.

When the object 10 and the sensor array 281 require a precise positional accuracy, that is, when they are approaching each other, a signal to reduce the rotational speed of the motor is transmitted from the drive control unit 103. A set distance (PC) 109 for changing the rotational speed of the motor is previously written as a data table in a memory 118 included in the control device 104. That is, the set distance (PC) 109 is a threshold value for changing the driving speed and is appropriately set according to the size of the grasping apparatus 1 or the form of the object 10.

When the pressure signal just corresponds with the value (set pressure (SP) 110) at which the grasping of the object 10 can be performed, the motor is stopped and the position of the arms 3 is kept. Also the set pressure for stopping the motor is previously written in the memory 118 included in the control device 104.

The power transmitting portion 117 converts mechanical output transmitted from the power source 116 to the grasping movement of the arms 3 with a not-shown gear or the like.

Subsequently, graphs (timing diagrams) of FIGS. 24A to 24C will be described.

In the graphs shown in FIGS. 24A to 24C, the horizontal axes (X-axes) are taken as time axes showing the same time series for the graphs A, B, and C. Hereinafter, each of the graphs will be described.

FIG. 24A is a graph showing a relation between the moving speed (speed of grasping operation) of the arm 3 and time. The vertical axis (Y-axis) of the graph shown in FIG. 24A shows the moving speed (speed of grasping operation: SA) and direction of the arm 3, in which the positive value (positive direction of Y-axis) shows that the arm 3 moves in a direction approaching the object 10.

The speed of grasping operation is divided into three levels in the embodiment: a constant speed (CS) when remote (R) 111; a low speed (LS) in proximity detection (PP) 112; and the speed of a microoperation (SS) in a grasping operation (MS) 113.

FIG. 24B is a graph showing a relation between the distance between the ultrasonic sensor 205 and the object 10, and time. The vertical axis (Y-axis) of the graph shown in FIG. 24B is a distance signal (DS) showing the distance between the ultrasonic sensor 205 and the object 10. When the ultrasonic sensor 205 contacts the object 10, 0 is output in principle.

FIG. 24C is a graph showing a relation between the pressure signal of the pressure sensor 206 and time. The vertical axis (Y-axis) of the graph shown in FIG. 24C is a pressure signal (PS) showing the pressure between the pressure sensor 206 and the object 10. When the pressure sensor 206 is away from the object 10, 0 is output in principle.

FIG. 23 is a flowchart showing a flow of a grasping method. Next, the grasping operation by the grasping apparatus 1 will be described according to the flowchart shown in FIG. 23. An operation in each step is executed based on the control signal from the control device 104 described above.

In Step S1, when the grasping surfaces 31 of the arms 3 as grasping arms shown in FIG. 22 are remote from the object 10 (the distance between the grasping surface 31 and the object 10 is greater than the set distance (PC) 109 described above), an operation to bring the arms 3 close to the object 10 is performed at uniform speed (constant speed (CS)) as shown in FIG. 24A.

This operation is applied when the distance signal shown in FIG. 24B is equal to or greater than the set distance (PC) 109 described above, which shows a state before T0 in the timing diagrams in FIGS. 24A to 24C.

In Step S2, it is determined based on a distance signal detected by the ultrasonic sensor 205 whether the distance between the grasping surface 31 and the object 10 is less than the set distance (PC) 109. If the distance signal between the arm. 3 and the sensor array 281 is less than the set distance (PC) 109 described above, the process proceeds to Step S3. If the distance signal is the set distance or greater, the process returns to Step S1. This operation corresponds to T0-T1 in the timing diagrams in FIGS. 24A to 24C.

In Step S3, the driving speed of the arm 3 is reduced to the low speed (LS). By reducing the speed, the distance between the arm 3 and the object 10 can be adjusted more precisely. This operation corresponds to T1-T3 in the timing diagrams in FIGS. 24A to 24C.

In Step S4, the contact between the grasping surface 31 and the object 10 is determined based on the pressure signal detected by the grasp detecting unit 102.

If the grasping surface 31 is not in contact with the object 10, the driving speed reduced in Step S3 is maintained.

If contact detection (CD) between the grasping surface 31 and the object 10 is made, the process proceeds to Step S5. This operation corresponds to T3-T4 in the timing diagrams in FIGS. 24A to 24C.

In Step S5, based on the pressure signal detected by the grasp detecting unit 102, the arms 3 shown in FIG. 22 are caused to perform the microoperation (SS) to finely adjust pressure given to the object 10. This operation corresponds to T4-T5 in the timing diagrams in FIGS. 24A to 24C.

In Step S6, determination is made based on a high and low relation between pressure received by the pressure sensor 206 and the set pressure (SP) 110 set with a range from a lower limit pressure to an upper limit pressure. If the pressure received by the pressure sensor 206 is lower than the lower limit pressure of the set pressure (SP) 110, the process returns to Step S5. If the pressure of the pressure sensor 206 is higher than the upper limit pressure of the set pressure 110, Step S8 is executed. If the pressure received by the pressure sensor 206 falls between the lower limit pressure and the upper limit pressure, the process proceeds to Step S7. This operation corresponds to T5-T9 in the timing diagrams in FIGS. 24A to 24C.

In Step S7, press control is stopped, and a holding operation is performed. This operation corresponds to T9 or later in the timing diagrams in FIGS. 24A to 24C.

By performing the above operations, the grasping apparatus 1 can grasp the object 10 at high speed with a highly accurate pressure.

During the holding operation, since the pressure sensor 206 differs from the ultrasonic sensor 205 in height by the thickness of the sealing film. 265, the ultrasonic sensor 205 does not contact the object 10 even when the pressure sensor 206 is slightly compressed by pressure. Therefore, in a usual grasping state, the ultrasonic sensor 205 can escape deterioration due to pressure, thereby maintaining high reliability.

Figure 15A:
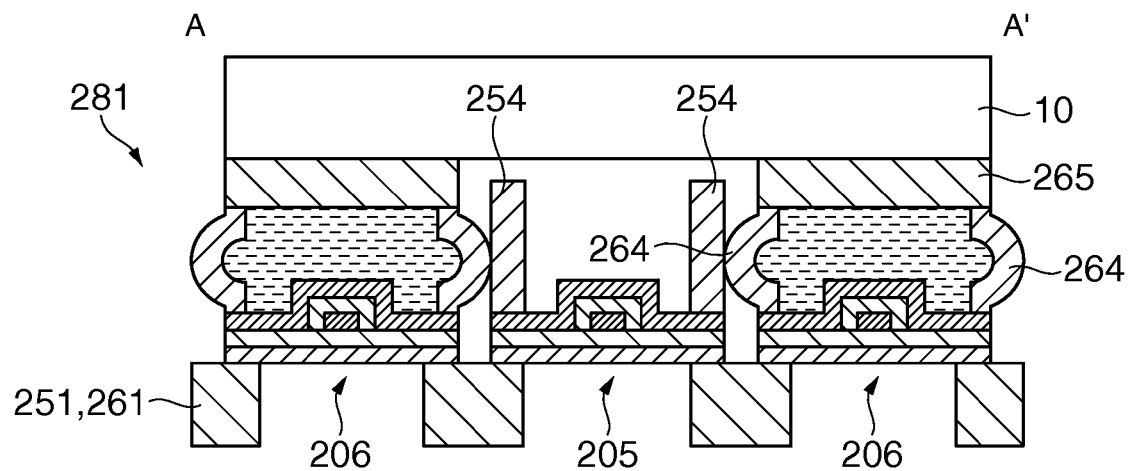
FIGS. 15A and 15B are cross-sectional views when pressure is applied to the sensor array.

In this case, when the deformation of the frame body 264 of the pressure sensor 206 is increased (strongly grasping state) with an abnormally increased pressure due to some factors, the groove K is filled, and the frame body 264 of the pressure sensor 206 contacts the second frame body 254 of the ultrasonic sensor 205, as shown in FIGS. 14B and 15A. By the contact of the frame body 264 with the second frame body 254, the characteristics of the ultrasonic sensor 205 change.

That is, the width of the groove K is preferably set such that when pressure having a smaller value than the allowable pressure, near the allowable pressure of the pressure sensor 206, is applied, the frame body 264 contacts the second frame body 254 of the ultrasonic sensor 205. By providing such a width, the reliability of the pressure sensor 206 can be improved.

Figure 15B:
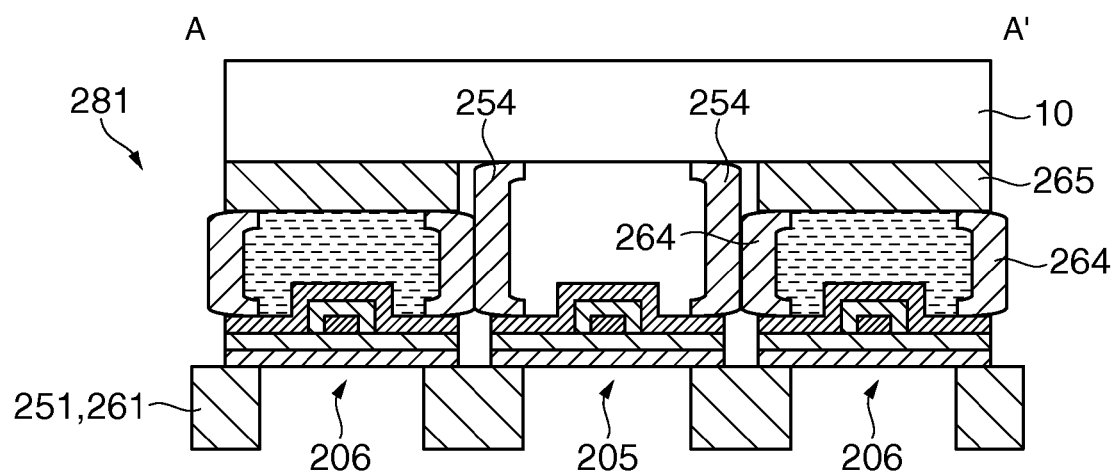

Moreover, when too much pressure equal to or greater than the allowable pressure is applied to the pressure sensor 206 in a short time, a control signal from the ultrasonic sensor 205 is delayed, and the pressure sensor 206 may be excessively collapsed and deteriorated. When excessive pressure is applied to the pressure sensor 206 and the pressure sensor 206 is deformed in the thickness direction by the thickness of the sealing film 265 (difference between the tops) or more, the ultrasonic sensor 205 starts deforming such that the central portion expands more than both ends with respect to the height direction of the second frame body 254. Therefore, as shown in FIG. 15B, the pressure sensor 206 and the ultrasonic sensor 205 next to each other function as each other's reinforcing materials, which can prevent the deterioration of the pressure sensor 206 or the ultrasonic sensor 205 caused by excessive collapse.

According to the configuration of the pressure sensor, the method for manufacturing the sensor array, and the grasping apparatus including the sensor array of the embodiment described above, the following advantageous effects can be provided.

Since the pressure sensor 206 differs from the ultrasonic sensor 205 in height by the thickness of the sealing film 265, the ultrasonic sensor 5 does not contact the object 10 even when the pressure sensor 206 is slightly compressed. Therefore, in a usual grasping state, the ultrasonic sensor 205 can escape deterioration due to pressure, thereby maintaining high reliability.

When the deformation of the frame body 264 of the pressure sensor 206 is increased, the groove K is filled, and the frame body 264 of the pressure sensor 206 contacts the second frame body 254 of the ultrasonic sensor 205. By the contact of the frame body 264 with the second frame body 254, the characteristics of the ultrasonic sensor 205 change. In this case, by setting the groove K such that when the pressure sensor 206 is deformed within the elastic limit thereof, the frame body 264 contacts the second frame body 254 of the ultrasonic sensor 205, the reliability of the pressure sensor 206 can be improved.

When excessive pressure is applied to the pressure sensor 206 and the pressure sensor 206 deforms in the thickness direction by the thickness of the sealing film 265 or more, the ultrasonic sensor 205 starts deforming such that the central portion expands more than both ends with respect to the height direction of the second frame body 254. Therefore, the pressure sensor 206 and the ultrasonic sensor 205 next to each other function as each other's reinforcing materials, which can prevent the deterioration of the pressure sensor 206 or the ultrasonic sensor 205 caused by excessive collapse.

Patterning is performed so as to leave the sealing film 265 located at the region overlapping with the frame body 264 and inside the frame body 264 to selectively remove the sealing film 265A, whereby the height of the second frame body 254 can be different from that of the frame body 264, making it possible to form the pressure sensor 206 and the ultrasonic sensor 205 including a step portion without increasing the number of manufacturing steps.

By performing the grasping operation according to the flowchart shown in FIG. 22, the grasping apparatus 1 can grasp the object 10 at high speed with highly accurate pressure.

Hereinafter, further another embodiment (fourth embodiment) according to the invention will be described based on the drawings.

Fourth Embodiment

Configuration of Sensor Array

Figure 25:
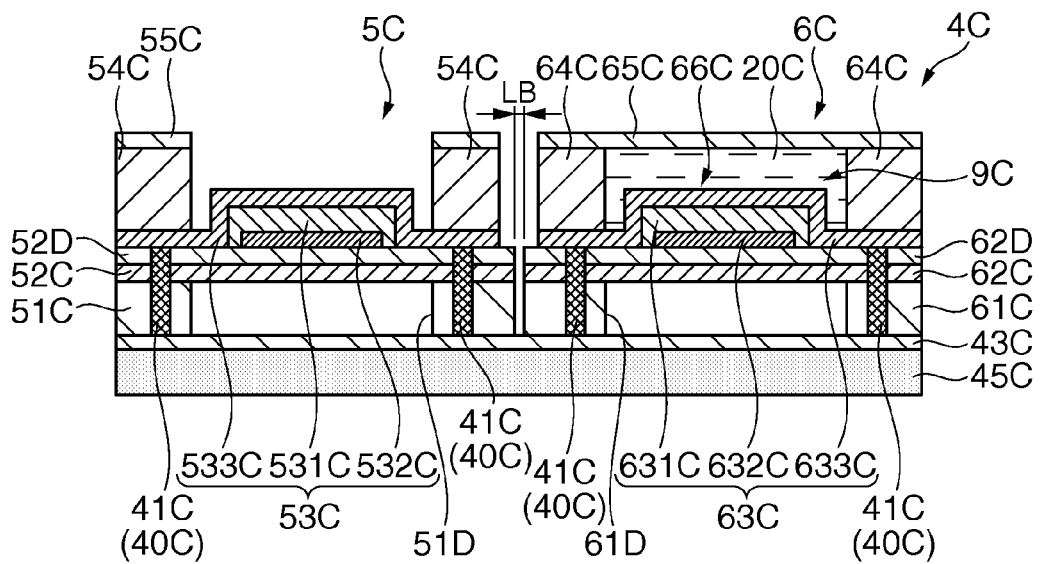
FIG. 25 is a cross-sectional view showing a sensor array.

FIG. 25 is a cross-sectional view showing a sensor array 4C according to the fourth embodiment. The sensor array 4C includes a sensor substrate 45C which supports an ultrasonic sensor 5C and a pressure sensor 6C.

The ultrasonic sensor 5C and the pressure sensor 6C include through-electrodes 41C in a second supporting body 51C and a supporting body 61C, respectively, and a wiring 43C provided on the sensor substrate 45C is connected to the through-electrodes 41C, whereby the ultrasonic sensor and the pressure sensor are electrically conducted to a not-shown control portion via the wiring. A gap is provided between second frame bodies 54C, between frame bodies 64C, and between the second frame body 54C and the frame body 64C. A groove LB as a gap is provided between the second supporting body 51C and the supporting body 61C. With the groove LB, edge cutting is performed between the ultrasonic sensors next to each other, between the pressure sensors next to each other, and between the ultrasonic sensor and the pressure sensor next to each other, whereby they are divided (independent). As will be described below, the sensor array 4C is similar to that of the first embodiment described above except for including the sensor substrate 45C and including the groove LB between the second supporting body 51C and the supporting body 61C. Moreover, a common supporting body may be used for the second supporting body 51C and the supporting body 61C.

The term "edge cutting" as used herein means a state where the ultrasonic sensors next to each other or the pressure sensors next to each other are independent. A state where the supporting body is not completely separated but a separating groove is partially formed is also referred to as "edge cutting".

Since the pressure sensor and the ultrasonic sensor are each supported by the sensor substrate and mechanically divided while including the supporting body, they do not interfere with each other, making it possible to detect pressure with high accuracy.

In the sensor array 4C, the sensors 5C and 6C may be alternately provided at equal distances along, for example, a predetermined first direction (X-direction) and a second direction (Y-direction) perpendicular to the first direction (X-direction).

Also in this case, a structure in which a protective film 55C is removed may be used. Then, since the height from the sensor substrate 45C to a top of the pressure sensor 6C is higher than the height from the sensor substrate 45C to a top of the ultrasonic sensor 5C, the top of the ultrasonic sensor 5C does not contact an object. Therefore, the ultrasonic sensor 5C can escape deterioration due to pressure and maintain high reliability (resistance to pressure).

Configuration of Ultrasonic Sensor

FIG. 25 is the cross-sectional view showing the configuration of the sensor array 4C including the ultrasonic sensor 5C.

The ultrasonic sensor 5 includes a second supporting film, a second piezoelectric body 53C, the second frame body 54C, and the protective film 55C which are stacked in order on the second supporting body 51C.

The second supporting film and the second piezoelectric body 53C constitute an ultrasonic transducer portion.

The second supporting body 51C is formed of a single-crystal silicon substrate and formed to a thickness of about 200 μm. In the second supporting body 51C, a circular second opening 51D, in plan view when the second supporting film is viewed from the film thickness direction, is formed by dry etching.

The second supporting film closes the second opening 51D of the second supporting body 51C and is configured of a first oxide film 52C and a second oxide film 52D which are stacked on the surface of the second supporting body 51C. The first oxide film 52C is formed of, for example, $SiO_2$ and formed to a thickness of about 1 μm by thermally oxidizing the surface of the single-crystal silicon substrate of the second supporting body 51C. The second oxide film 52D is formed of, for example, $ZrO_2$ and formed on the first oxide film 52C so as to have a thickness of about 3 μm by depositing Zr by sputtering and thermally oxidizing the same.

The diameter dimension of the second opening 51D is appropriately set in a range from, for example, about one hundred μm to several hundreds μm according to the natural frequency of a second diaphragm portion. The second diaphragm portion vibrates, whereby ultrasonic waves are transmitted toward the object 10 (refer to FIG. 1) side.

The second piezoelectric body 53C is a film-like member which is formed concentrically with the second opening 51D in plan view of the sensor. The diameter dimension of the second piezoelectric body 53C is smaller than the diameter dimension D' of the second opening 51D. The second piezoelectric body 53C includes a second piezoelectric film 531C and electrodes (a lower electrode 532C and an upper electrode 533C) which apply voltage to the second piezoelectric film 531C. The term "diameter dimension of piezoelectric body" as used herein means the diameter of a region where the lower electrode, the piezoelectric film, and the upper electrode are stacked.

The second piezoelectric film 531C is formed of, for example, lead zirconate titanate (PZT) made into a film. The lower electrode 532C is formed below the second piezoelectric film 531C. The upper electrode 533C is formed on the second piezoelectric film 531C.

The upper electrode 533C and the lower electrode 532C are drawn through a not-shown drawing portion which is formed on the back side (the second opening 51D side) of the ultrasonic sensor 5C, are connected to a not-shown control portion of the sensor array 4C, and apply a predetermined voltage to the piezoelectric film 531C based on a voltage signal input from the control portion.

The second frame body 54C is cylindrically formed of a permanent resist made of a synthetic resin material having flexibility and formed to a thickness of about 100 μm to 600 μm. Moreover, with a cylindrical inner peripheral wall provided in the second frame body 54C, a cavity along the film thickness direction of the second supporting film is formed. The second frame body 54C is formed such that in plan view when viewed from the film thickness direction of the second supporting film, a cylindrical inner peripheral edge of the cavity which is cylindrical is positioned to be overlapped with an inner peripheral edge of the second opening 51D or positioned outside of the inner peripheral edge. In this case, the inner diameter dimension of the second frame body 54C is formed so as to have substantially the same dimension as that of the second opening 51D (the case of overlapping). In the cavity of the second frame body 54C, a membrane is contained. For example, the second frame body 54C can be formed using permanent resist TMMR™ S2000 of TOKYO OHKA KOGYO CO., LTD.

The protective film 55C is a portion which contacts the object 10, is formed of a dry film resist made of a synthetic resin material having flexibility, similarly to the second frame body 54C, and is formed to a thickness of about 100 μm. Moreover, the protective film 55 is formed in a ring shape to cover an upper end surface of the second frame body 54C. For example, the protective film 55 can be formed using dry film resist TMMF™ S2000 of TOKYO OHKA KOGYO CO., LTD.

Configuration of Pressure Sensor

FIG. 25 is the cross-sectional view showing the configuration of the sensor array 4C including the pressure sensor 6C.

The pressure sensor 6C detects pressure when, for example, the grasping surfaces 31 of the arms 3 of the grasping apparatus 1 (refer to FIG. 1) grasp the object 10. The pressure sensor 6C includes a supporting film, a piezoelectric body 63C (a piezoelectric film 631C, a lower electrode 632C, and an upper electrode 633C), the frame body 64C, and a sealing film 65C which are stacked in order on the supporting body 61C.

The supporting film closes an opening 61D of the supporting body 61C and is configured of a first oxide film 62C and a second oxide film 62D which are stacked on the surface of the supporting body 61C. The supporting film and the piezoelectric body 63C constitute a pressure detecting portion 9C.

The frame body 64C is formed cylindrically, similarly to the second frame body 54C of the ultrasonic sensor 5C, and has a cavity. In the cavity, a membrane including a diaphragm portion which is a portion of the supporting film where the opening 61A is closed and the piezoelectric body 63C which is provided on the diaphragm portion is contained.

Thus, a silicone oil 20C as a pressure medium is filled in the inner space 66C formed of a cylindrical inner peripheral wall of the cavity, the sealing film 65C, and the pressure detecting portion.

The sealing film 65C closes the inner space 66C to seal the silicone oil 20C. As the material to be filled in the inner space 66C, any material which disperses pressure may be used. Other than the silicone oil 20C, for example, a silicone rubber, a polymer gel, a synthetic gel, a natural gel, a polymer resin, or the like may be used. The frame body 64C is formed such that in plan view when viewed from the film thickness direction of the supporting film, a cylindrical inner peripheral edge of the cavity which is cylindrical is positioned to be overlapped with an inner peripheral edge of the opening 61D or positioned outside of the inner peripheral edge. In this case, the inner diameter dimension of the frame body 64C is formed so as to have substantially the same dimension as the diameter dimension D of the opening 61D (in the case of overlapping).

The sealing film 65C is a portion which contacts the object 10 (refer to FIG. 1), similarly to the protective film 55C, and is formed in a circular shape so as to close the inner space 66C to seal the silicone oil 20C. Moreover, the sealing film 65C is a portion which seals the silicone oil 20C and contacts the object 10. The sealing film 65C is formed of the same material as that of the protective film 55C. For example, the sealing film 65C can be formed using dry film resist TMMF™ S2000 of TOKYO OHKA KOGYO CO., LTD.

Since the silicone oil 20C is filled in the inner space 66C, an impact when the object 10 contacts the sealing film 65C is dispersed over the entire membrane 8.

When a pressure medium filled in the inner space 66C is a material which does not leak, such as a polymer gel, the sealing film 65C may not be provided.

Method for Manufacturing Sensor Array

Figure 26:
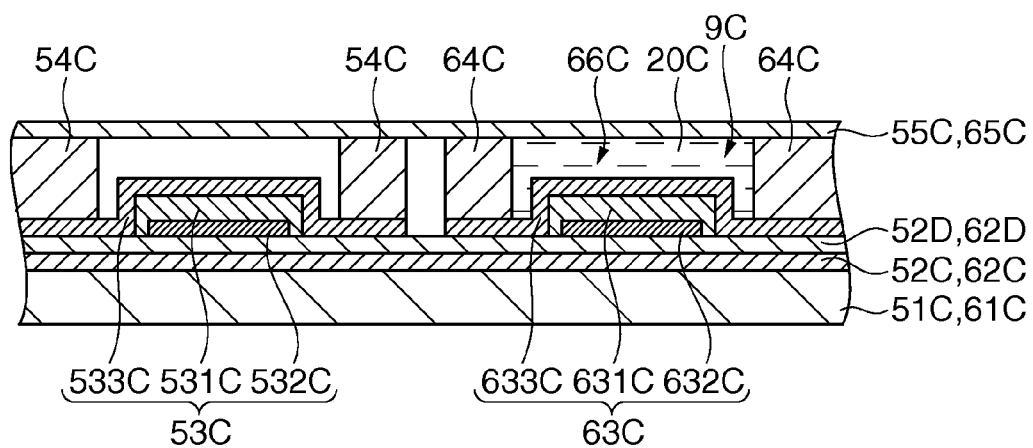
FIG. 26 shows a manufacturing step of the sensor array.
Figure 27A:
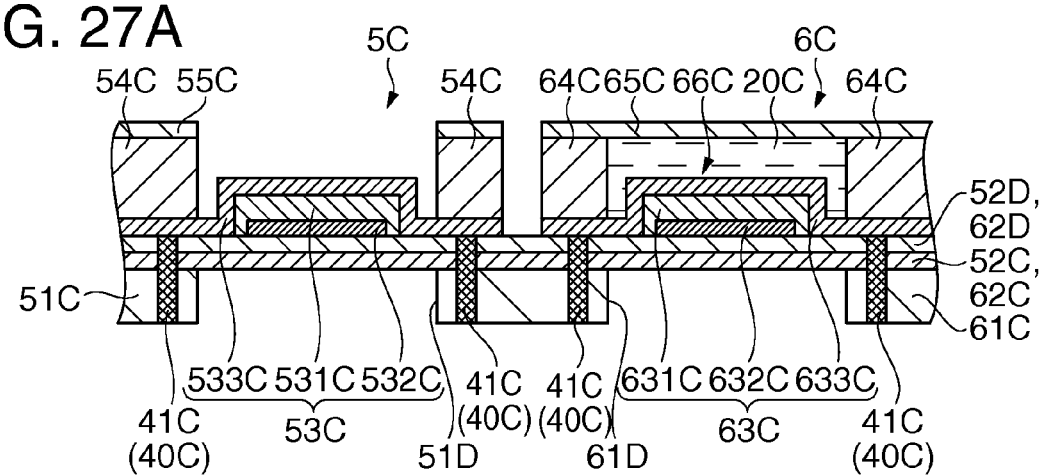
FIGS. 27A to 27C show manufacturing steps of the sensor array.
Figure 27B:
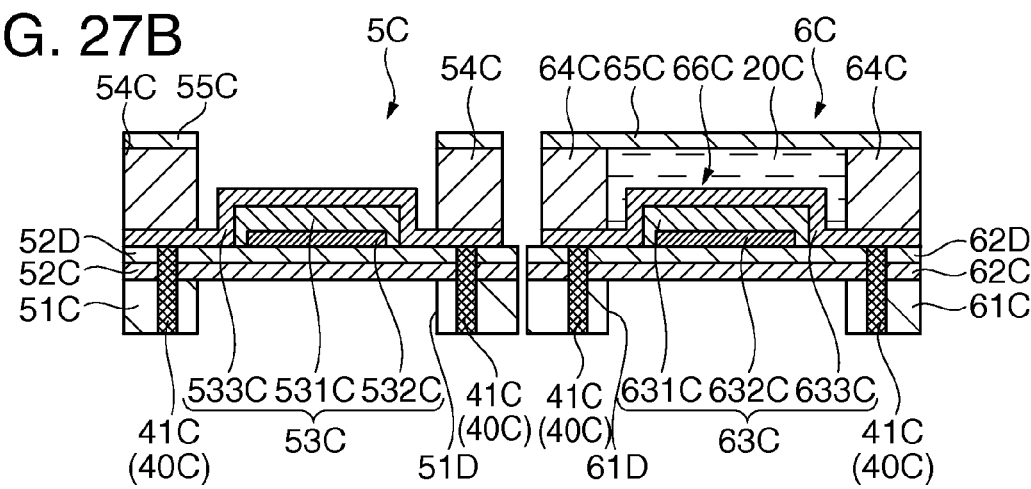
Figure 27C:
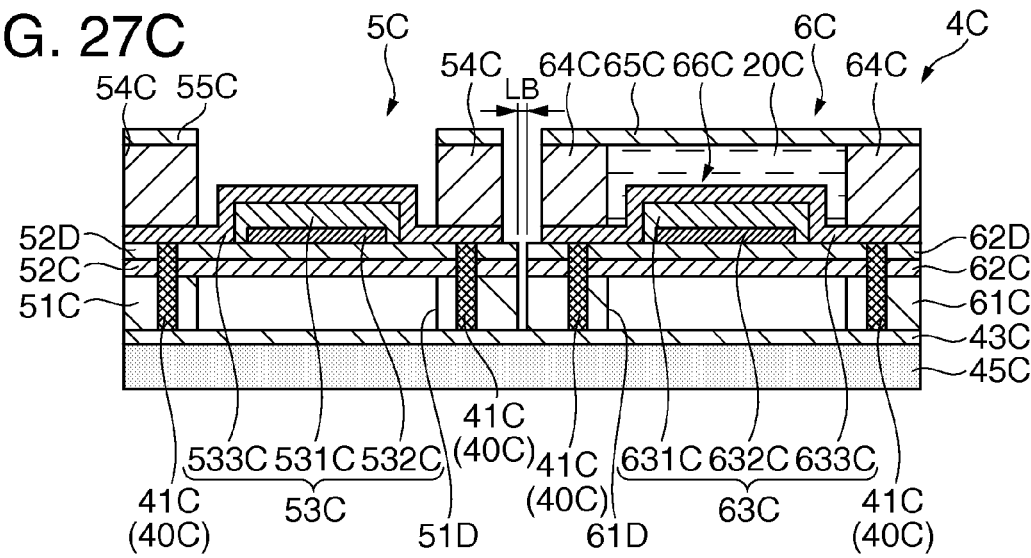

Next, a method for manufacturing a sensor array using a step of forming the groove LB, in which the sensor substrate 45C is bonded to the lower surface side of the common supporting body 51C, 61C and thereafter, edge cutting is performed for the common supporting body 51C, 61C while leaving at least a portion of the sensor substrate 45C, will be described. FIGS. 26 to 27C are step cross-sectional views showing manufacturing steps of the sensor array. In FIGS. 26 to 27C, manufacturing steps of the ultrasonic sensor 5C are shown on the left while manufacturing steps of the pressure sensor 6C are shown on the right.

In the following description, a pair of ultrasonic sensor 5C and pressure sensor 6C are described. However, this is applicable also to the case where a plurality of ultrasonic sensors 5C and pressure sensors 6C are provided (refer to FIG. 2).

As for the way of dividing, the pressure sensors 6C or the ultrasonic sensors 5C may be once divided into individual ones, and thereafter, they may be bonded to the sensor substrate 45C on another occasion. Moreover, some of the pressure sensors 6C or the ultrasonic sensors 5C may be collectively divided.

The description for steps of preparing a single-crystal silicon substrate which serves as the common supporting body 51C, 61C; forming, on one surface thereof, the common supporting film (formed of the first oxide film 52C, 62C and the second oxide film 52D, 62D), the piezoelectric body 63C, the second piezoelectric body 53C, the frame body 64C, and the second frame body 54C; filling a silicone oil in the cavity of the frame body 64C serving as the pressure sensor 6C; and coating a dry film resist corresponding to the protective film 55C and the sealing film 65C using a roll coating apparatus is similar to that of the method for manufacturing the sensor array of the first embodiment described above. Therefore, the description is omitted. FIG. 26 shows the cross-sectional view in a state where the step of coating the protective film 55C and the sealing film 65C is completed. The supporting film and the piezoelectric body 63C constitute the pressure detecting portion 9C.

An example of forming the groove LB, in which the sensor substrate 45C after this step is bonded to the lower surface side of the common supporting body 51C, 61C and thereafter, edge cutting is performed for the second supporting body 51C and the supporting body 61C while leaving at least a portion of the sensor substrate 45C, will be described below.

First, through-holes 40C are formed through the common supporting body 51C, 61C using dry etching, and thereafter, an insulating layer is formed on the side wall of the through-hole 40C by CVD or the like. Next, Au is embedded in the through-hole 40C by plating, whereby the through-electrode 41C is formed. Next, the coated dry film resist corresponding to the protective film 55C and the sealing film 65C is exposed and developed by a photolithography method. Further by an etching process, the protective film 55C and the sealing film 65C are patterned into a desired shape. Thereafter, the lower surface side of the common supporting body 51C, 61C is dry etched to form the second opening 51D and the opening 61D having substantially the same diameters as the inner diameter dimensions of the second frame body 54C and the frame body 64C. FIG. 27A shows the cross-sectional view in a state where the steps so far are completed.

Next, edge cutting is performed to divide the ultrasonic sensor 5C and the pressure sensor 6C. FIG. 27B shows the cross-sectional view in a state where the steps so far are completed.

Next, the ultrasonic sensors 5C and the pressure sensors 6C are arranged and fixed on the sensor substrate 45C with a gap having the width of the groove LB, whereby the sensor array 4C including the plurality of ultrasonic sensors 5C and pressure sensors 6C on the sensor substrate 45C is formed. FIG. 27C shows the cross-sectional view in a state where the steps so far are completed.

Although, in the embodiment, an example of including the ultrasonic sensors 5C and the pressure sensors 6C has been described, a sensor array only including the pressure sensors 6C can be formed similarly.

In the sensor array of the embodiment, the following advantageous effects can be provided in addition to the advantageous effects in the first to third embodiments.

Since the ultrasonic sensor 5C and the pressure sensor 6C are arranged via the groove therebetween (independently), it is possible to suppress the transmission of vibrations of the membrane of the ultrasonic sensor to the pressure sensor. That is, since the influence of vibrations from the ultrasonic sensor on the piezoelectric body or diaphragm portion of the membrane of the pressure sensor is reduced, the pressure sensor can detect pressure with good accuracy.

Since the ultrasonic sensor 5C and the pressure sensor 6C are once divided and then bonded to the sensor substrate 45C, the embodiment can also deal with the sensor substrate 45C larger than the second supporting body 51C or the supporting body 61C. Moreover, since the second supporting body 51C or the supporting body 61C is usually more expensive than the sensor substrate 45C, the manufacturing cost can be reduced by once dividing the ultrasonic sensor and the pressure sensor and then bonding them to the sensor substrate 45C.

Modifications of Embodiments

The invention is not limited to the embodiments described above, but various kinds of changes or improvements can be added to the embodiments described above. Modified examples will be described below.

FIRST MODIFIED EXAMPLE

Figure 8:
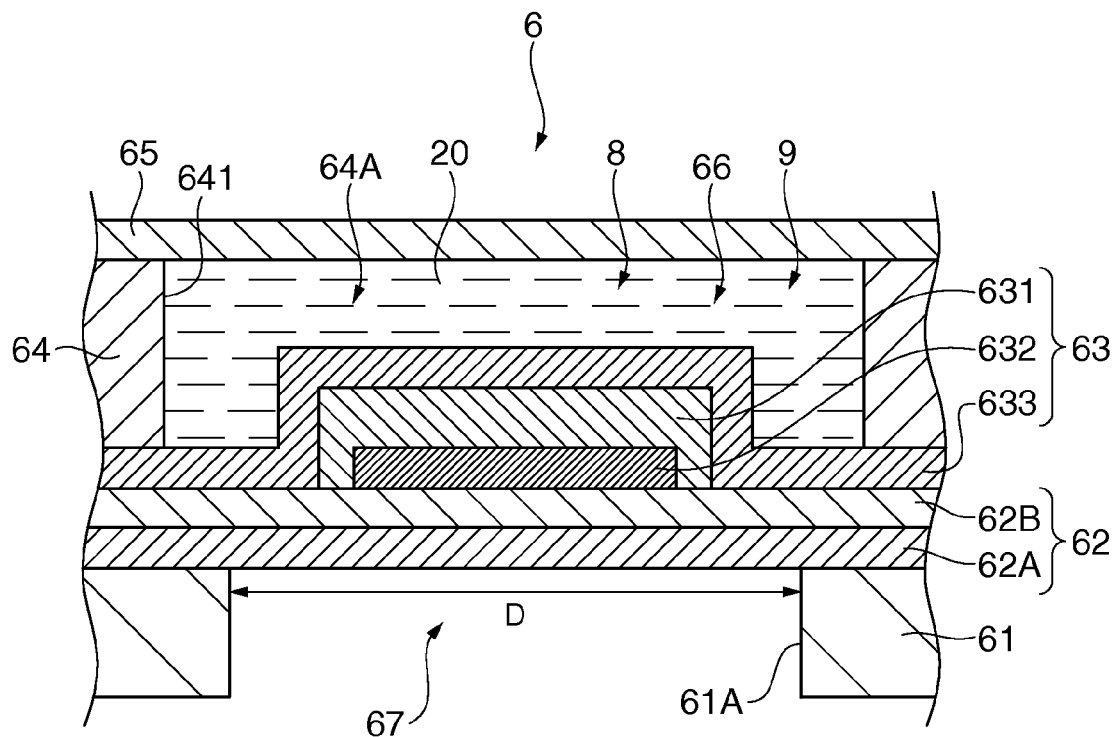
FIG. 8 shows a modified example according to a first embodiment.

A description will be made with reference to FIG. 8. FIG. 8 shows a modified example according to the invention.

In the embodiment, the inner diameter dimension of the frame body 64 has substantially the same dimension as the diameter dimension D of the opening 61A. However, the modified example differs from the embodiment in that the inner diameter dimension of the frame body 64 is larger than the diameter dimension D of the opening 61A.

SECOND MODIFIED EXAMPLE

A description will be made with reference to FIG. 2. In FIG. 2, the pressure sensors 6 and the ultrasonic sensors 5 are arranged at equal distances from each other on the common supporting body 51, 61 in the embodiment. However, they are not limited to this arrangement, but any arrangement may be adopted. Specifically, as long as the pressure sensors 6 and the ultrasonic sensors 5 are uniformly arranged dispersedly in the plane of the common supporting body 51, 61, a variation does not occur between a position at which the ultrasonic sensor 5 recognizes an object and a position at which the pressure sensor 6 detects a force grasping the object.

THIRD MODIFIED EXAMPLE

A description will be made with reference to FIGS. 3A and 3B. In FIG. 3A, the ultrasonic sensor 5 is configured to transmit ultrasonic waves toward the membrane 8 side. However, the ultrasonic sensor 5 may be configured to transmit ultrasonic waves also toward the second opening 51A side.

FOURTH MODIFIED EXAMPLE

A description will be made with reference to FIG. 7B. In FIG. 7B, the frame body 64 and the second frame body 54 of the ultrasonic sensor 5 and the pressure sensor 6 are formed independently of each other. However, the second frame body 54 and the frame body 64 next to each other may be integrated, so that the pressure sensor 6 and the ultrasonic sensor 5 may be configured so as to be paired.

FIFTH MODIFIED EXAMPLE

A description will be made with reference to FIGS. 9 and 10A. As shown in FIGS. 9 and 10A, an example in which the pressure sensors 106 each of which has the frame body 164 whose outer shape is a square are arranged via the groove G on the supporting body 161 included in the sensor array 180 has been described. However, the outer shape is not limited to a rectangle. For example, a shape, such as an isosceles triangle, a right triangle, a trapezoid, or a regular hexagon, which fills a plane may be arranged at distances corresponding to the groove G. In the case of using the outer shape described above, when excessive pressure is applied to the pressure sensor 106, the pressure sensor is pushed to the next frame body 164 at a plane. Therefore, compared to the case where, for example, the outer shape of the frame body 164 is a circle or the like, resistance to high pressure can be further improved.

Moreover, as shown in FIG. 13, when the example is applied to the sensor array 281 having also the ultrasonic sensors 205, some of the pressure sensors 206 may be replaced with the ultrasonic sensors 205. Also in this case, a similar advantageous effect can be obtained.

SIXTH MODIFIED EXAMPLE

A description will be made with reference to FIGS. 10A and 14A. As shown in FIGS. 10A and 14A, as the description for the sensor arrays 180 and 281, the sensor arrays in which the planar shape of diaphragm portions 107 and 207 and the second diaphragm portion 207B is a circle have been described. However, the planar shape may be an ellipse, a rectangle, a regular hexagon, or any other shape. By making the outer shape ellipsoidal or rectangular for example, it is possible to improve the effective areas of the diaphragm portions 107 and 207 and the second diaphragm portion 207B in the frame body 64 and the second frame body 54. Moreover, by making the outer shape regular hexagonal, and accordingly, by making the outer shape of the frame body 64 and the second frame body 54 regular hexagonal, the effective areas of the diaphragm portions 107 and 207 and the second diaphragm portion 207B can be highly secured.

SEVENTH MODIFIED EXAMPLE

A description will be made with reference to FIG. 14A. In the case of the sensor array 281 including the ultrasonic sensors 205 in addition to the pressure sensors 206 shown in FIG. 14A, the outer shape of the frame body 264 (254) may be a circle or any other shape without limiting to the shape which fills a plane. As long as the pressure sensor 206 and the ultrasonic sensor 205 are arranged to be spaced from each other by the groove K, when the pressure sensor 206 is deformed within the elastic limit thereof, the frame body contacts the second frame body 254 of the ultrasonic sensor 205, and a signal from the ultrasonic sensor 205 is modulated by this contact. Therefore, this modulated amount is detected, and pressure is adjusted, whereby the reliability of the pressure sensor 206 can be improved.

EIGHTH MODIFIED EXAMPLE

A description will be made with reference to FIGS. 10A to 10C, 13, 14A, 14B, and 18 to 21B.

Figure 18:
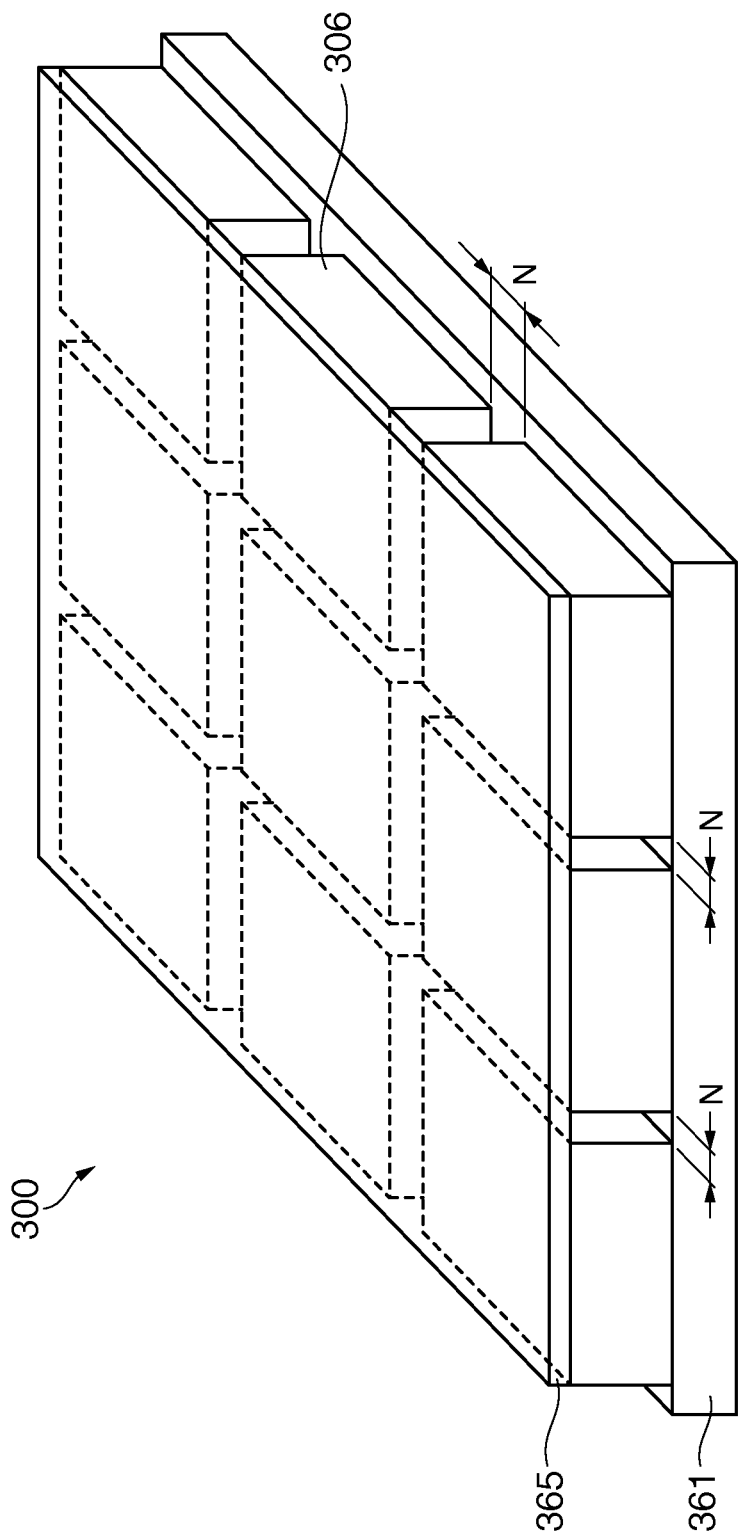
FIG. 18 is a perspective view showing a sensor array.
Figure 19A:
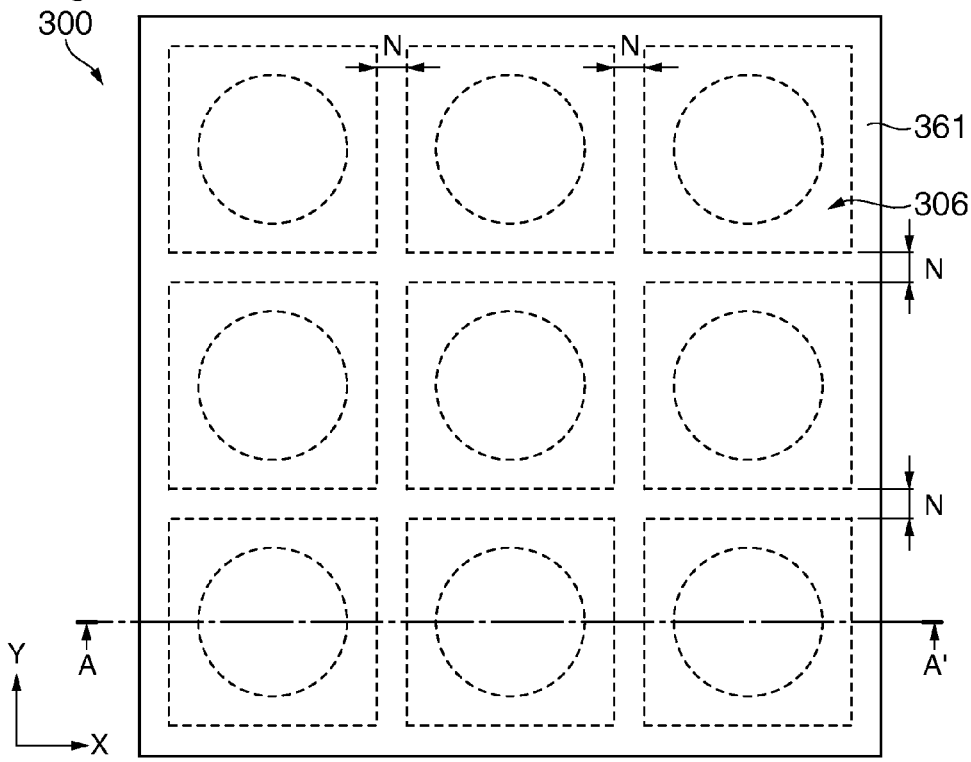
FIGS. 19A, 19B, and 19C are a plan view and cross-sectional views, respectively, showing the sensor array.
Figure 19B:
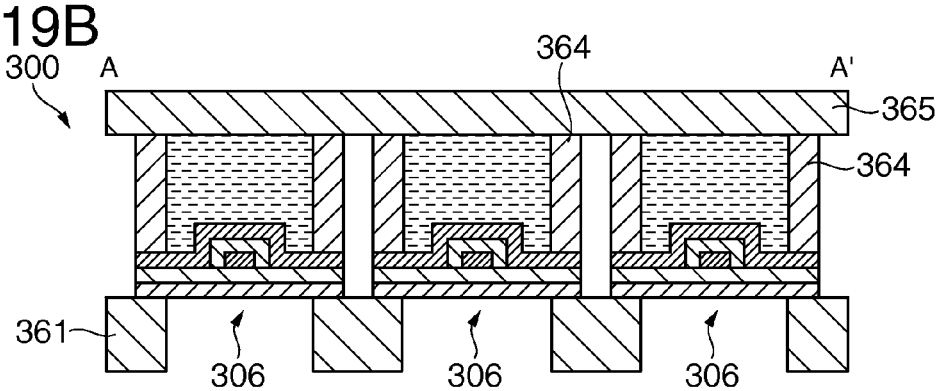
Figure 19C:
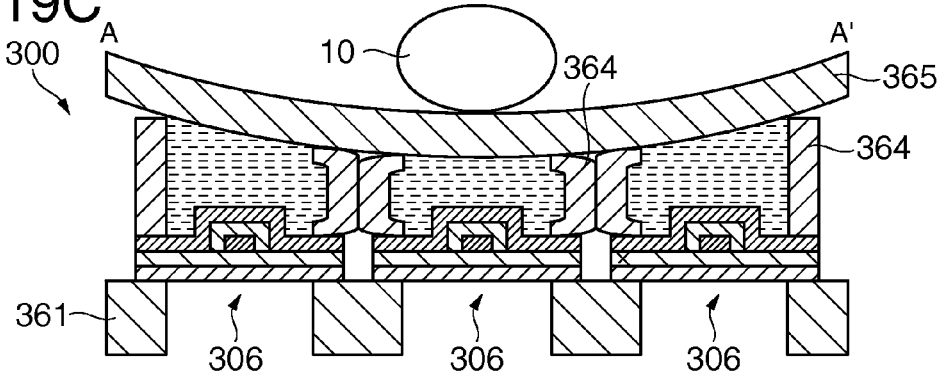
Figure 20:
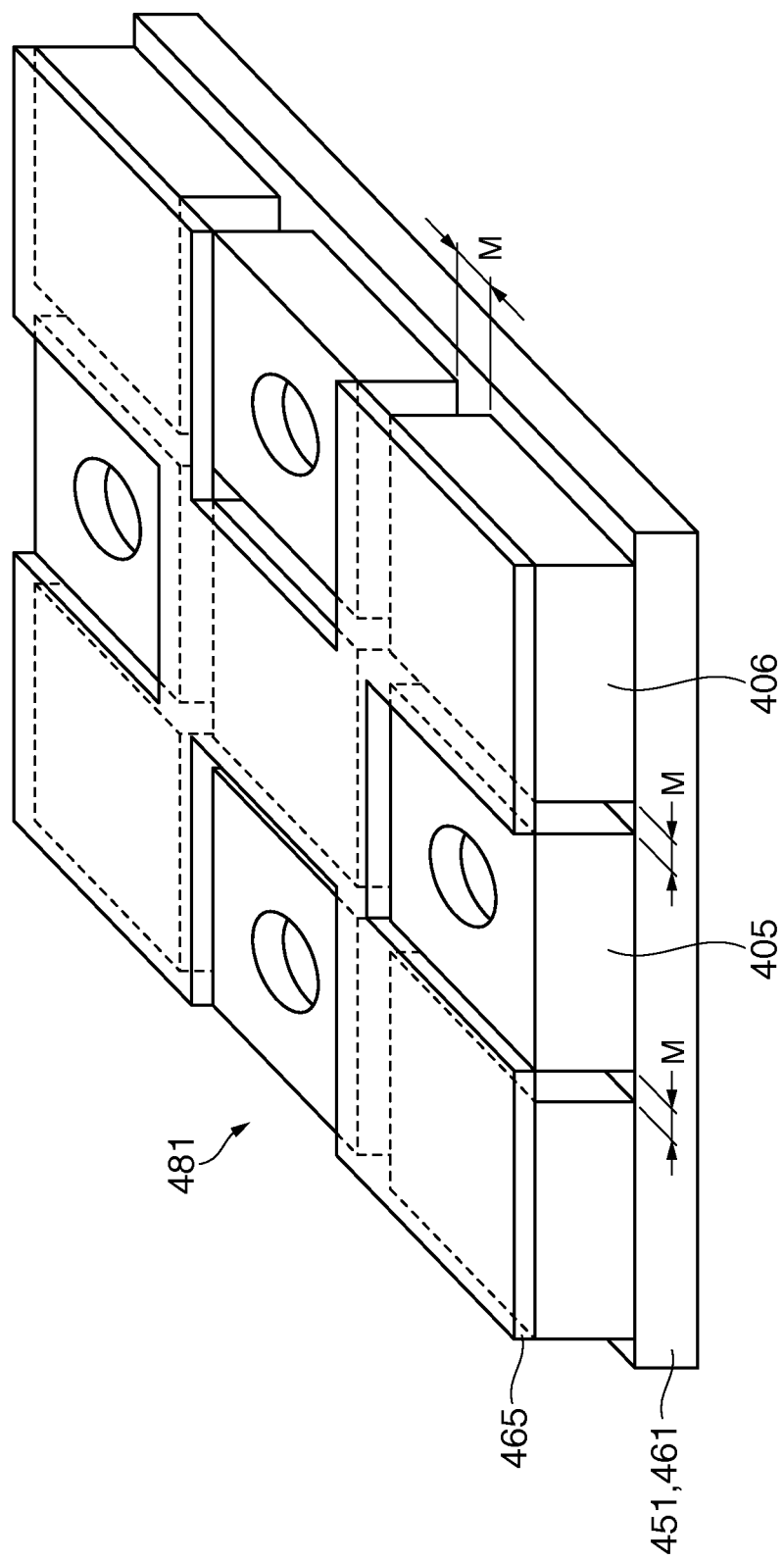
FIG. 20 is a perspective view showing a sensor array.
Figure 21A:
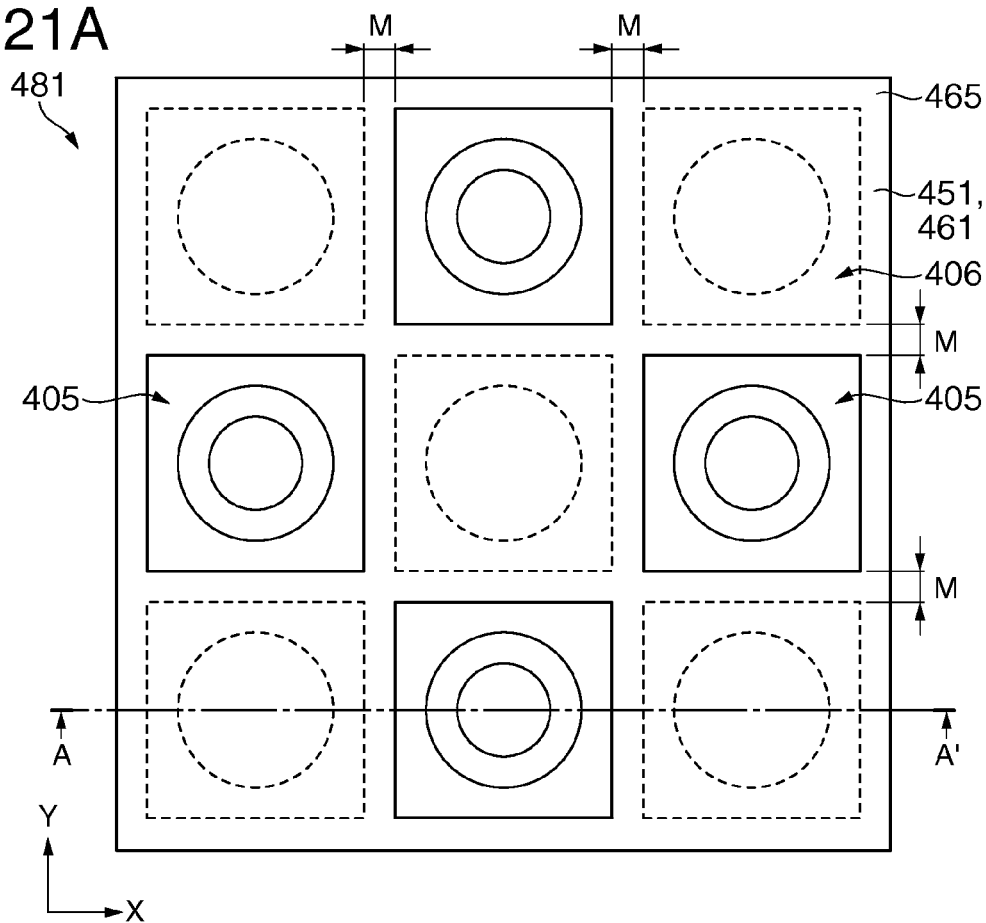
FIGS. 21A and 21B are a plan view and a cross-sectional view, respectively, showing the sensor array.
Figure 21B:
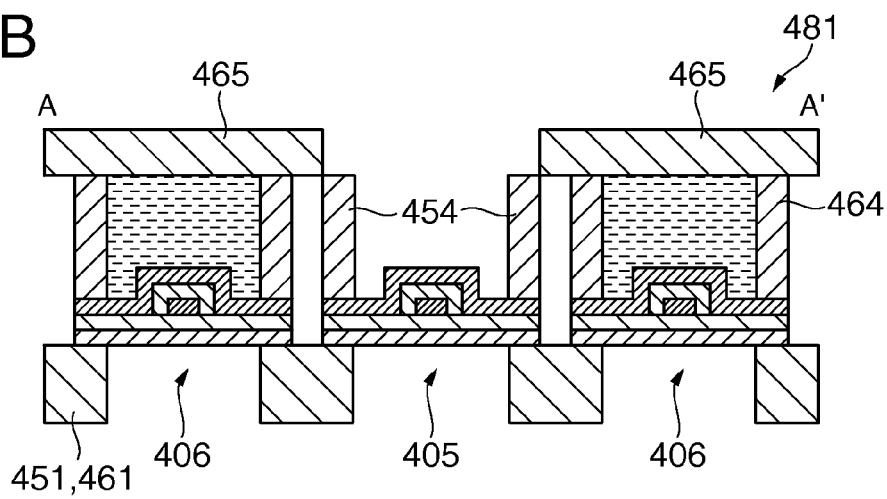

FIG. 18 is a perspective view of a sensor array. FIG. 19A is a plan view of the sensor array; FIG. 19B is a cross-sectional view taken along line A-A' of the plan view shown in FIG. 19A; and FIG. 19C is a schematic cross-sectional view when the sensor array is subjected to pressure from the object 10. FIG. 20 is a perspective view of a sensor array. FIG. 21A is a plan view of the sensor array shown in FIG. 20; and FIG. 21B is a cross-sectional view taken along line A-A' of the plan view shown in FIG. 21A.

A sensor array 300 shown in FIG. 18 includes a plurality of pressure sensors 306 mounted on a supporting body 361. In the sensor array 180 shown in FIGS. 10A to 10C, the sealing film 165 is provided only for the pressure sensor 106, but, as shown in FIG. 18, this may have a configuration including a sealing film 365 over the entire surface of the sensor array so that the sealing film is common to frame bodies 364. In this case, pressure applied to the pressure sensor 306 is dispersed by the sealing film 365 as shown in FIGS. 19B and 19C because the sensor array has a structure shown in FIGS. 18 and 19A. Therefore, the sensor array 300 which is less susceptible to breakage can be provided.

In the case of the sensor array 481 including ultrasonic sensors 405 in addition to pressure sensors 406, the sensor array may have a configuration including, instead of the sealing film 265 shown in FIGS. 13, 14A, and 14B, a sealing film 465 excepting a region of the ultrasonic sensors 405 as shown in FIG. 20. The sensor array 481 shown in FIG. 20 includes the plurality of ultrasonic sensors 405 in addition to the plurality of pressure sensors 406 mounted on a common supporting body 451, 461. As shown in FIGS. 21A and 21B, the sealing film 465 is provided on a frame body 464 but the sealing film 465 is not provided on a second frame body 454. In this case, pressure applied to the pressure sensor 406 is dispersed by the sealing film 465 because the sensor array has the structure shown in FIGS. 20, 21A, and 21B. Therefore, the sensor array 481 which is less susceptible to breakage can be provided.

NINTH MODIFIED EXAMPLE

A description will be made with reference to FIG. 2.

In the first embodiment, an example in which the pressure sensors 6 and the ultrasonic sensors 5 are integrated on one substrate has been described. This may be separated by, for example, dicing and then bonded to another substrate for use. In this case, especially when the pressure sensors 6 or the ultrasonic sensors 5 are formed in a wide range, the cost can be reduced because a large substrate is not required.

TENTH MODIFIED EXAMPLE

Figure 28:
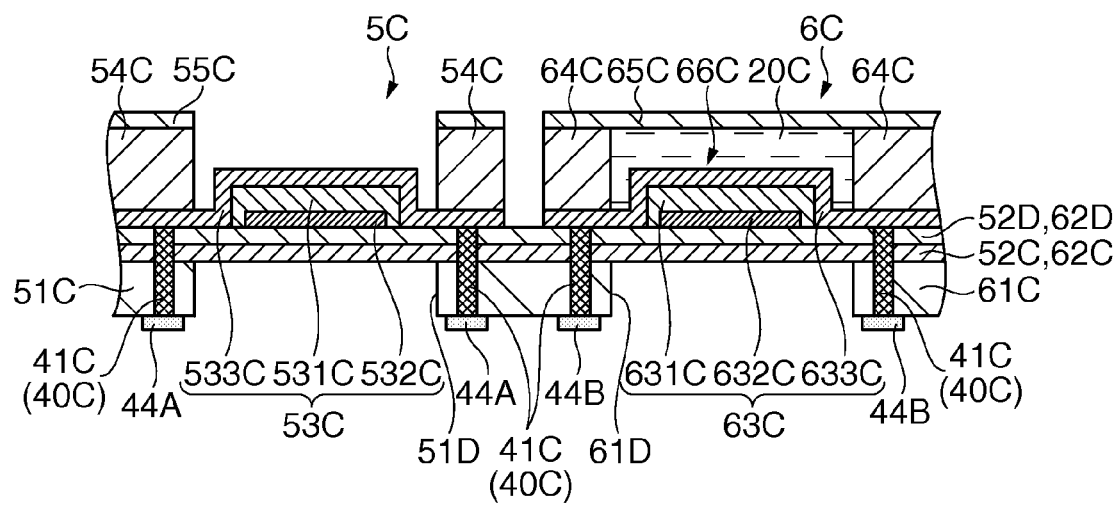
FIG. 28 is a cross-sectional view showing the sensor array.

A description will be made with reference to FIGS. 14A, 14B, and 28.

In the third embodiment as shown in FIG. 14B, electrical conduction is established between the ultrasonic sensor 205 and the pressure sensor 206, and the not-shown control portion which controls the ultrasonic sensor 205 and the pressure sensor 206 via the electrode pattern (wiring) formed on the second supporting film 252 and the supporting film 262 (in a direction from the common supporting body 251, 261 toward the frame body 264 and the second frame body 254). That is, the wiring is formed on the upper side of the sensor array 281, and the ultrasonic sensor 205 and the pressure sensor 206 are electrically conducted to the control portion via the wiring. In this case, since the wiring located at the region overlapping with the groove K for edge cutting is removed, the wiring is formed so as to avoid the portion of the groove K. In the modified example, on the other hand, wirings 44A and 44B for electrically conducting to the through-electrodes 41C are formed by sputtering Au and then patterning the same as shown in FIG. 28. The wirings 44A and 44B are provided. Therefore, in plan view of the common supporting body 251, 261, the wirings 44A and 44B can be formed also in the portion of the groove K for edge cutting. That is, the wiring region can be formed also in the region of the groove K for edge cutting, which can improve the degree of freedom of the wiring pattern.

What is claimed is:
1. A sensor array comprising:
a pressure sensor which has
a supporting body which has an opening,
a pressure detecting portion which includes
a supporting film provided on the supporting body and having a diaphragm portion closing the opening, and
a piezoelectric body provided on the diaphragm portion and deflecting to output an electric signal,
a frame body which has, on the pressure detecting portion, a cylindrical cavity along a film thickness direction of the supporting film, and is formed, in plan view when viewed from the film thickness direction of the supporting film, at a position where a cylindrical inner peripheral wall of the cavity overlaps with an inner peripheral edge of the opening, or outside of the inner peripheral edge of the opening,
a sealing film which closes the frame body, and
a pressure medium which is filled in an inner space formed of the cylindrical inner peripheral wall of the cavity, the sealing film, and the pressure detecting portion; and
an ultrasonic sensor which has
a second supporting body having a second opening, and
an ultrasonic transducer portion including a second supporting film which is provided on the second supporting body and has a second diaphragm portion closing the second opening, and a second piezoelectric body which is provided on the second diaphragm portion and deflects by the application of voltage.
2. The sensor array according to claim 1, wherein
the ultrasonic sensor further includes a second frame body which has, on the ultrasonic transducer portion, a cylindrical second cavity along a film thickness direction of the second supporting film, and is formed, in plan view when viewed from the film thickness direction of the second supporting film, at a position where a cylindrical inner peripheral wall of the second cavity overlaps with an inner peripheral edge of the second opening, or outside of the inner peripheral edge of the second opening.
3. The sensor array according to claim 2, wherein
the sensor array includes a plurality of the pressure sensors and a plurality of the ultrasonic sensors, and
a gap is formed between frame bodies of the pressure sensors next to each other, between second frame bodies of the ultrasonic sensors next to each other, or between a frame body of the pressure sensor and a second frame body of the ultrasonic sensor next to each other.
4. The sensor array according to claim 3, wherein
the supporting body and the second supporting body are a common supporting body which is common to them, and
a height from the common supporting body to a top of the pressure sensor is higher than a height from the common supporting body to a top of the ultrasonic sensor.
5. The sensor array according to claim 3, wherein
the pressure sensors and the ultrasonic sensors have a two-dimensional array structure in which the pressure sensor and the ultrasonic sensor are alternately arranged.
6. The sensor array according to claim 3, wherein
a dimension of the gap is set such that when a first pressure is applied to the pressure sensor, the frame body deforms to contact the frame body of the next pressure sensor or contact the second frame body of the next ultrasonic sensor, and
the first pressure is smaller than an allowable pressure of the pressure sensor.

* * * * *